(12) United States Patent
Wagner

(10) Patent No.: US 11,775,466 B1
(45) Date of Patent: Oct. 3, 2023

(54) SYSTEM AND METHODS OF RESTORATION FOR MULTI-DROP COMMUNICATION ARCHITECTURES AFTER SHORT CIRCUIT EVENT

(71) Applicant: Critical Communications, Controls and Instruments, LLC, Exeter, NH (US)

(72) Inventor: Charles Joseph Wagner, Stratham, NH (US)

(*) Notice: Subject to any disclaimer, the term of this patent is extended or adjusted under 35 U.S.C. 154(b) by 0 days.

(21) Appl. No.: 18/207,442

(22) Filed: Jun. 8, 2023

Related U.S. Application Data

(62) Division of application No. 17/941,180, filed on Sep. 9, 2022, now Pat. No. 11,714,774.

(60) Provisional application No. 63/242,203, filed on Sep. 9, 2021.

(51) Int. Cl.
*G06F 13/40* (2006.01)
*G06F 13/38* (2006.01)
*G01R 31/52* (2020.01)
*G01R 31/66* (2020.01)

(52) U.S. Cl.
CPC ......... *G06F 13/4068* (2013.01); *G01R 31/52* (2020.01); *G01R 31/66* (2020.01); *G06F 13/385* (2013.01); *G06F 2213/0002* (2013.01)

(58) Field of Classification Search
CPC ... G06F 13/4068; G06F 13/385; G01R 31/66; G01R 31/52
See application file for complete search history.

(56) References Cited

U.S. PATENT DOCUMENTS 9,294,604 B1 * 3/2016 Wagner ............. H04M 1/72427

* cited by examiner

*Primary Examiner* — David E Martinez
(74) *Attorney, Agent, or Firm* — Patent Negotiator, PLLC; Sarita Pickett, Esq.

(57) ABSTRACT

An endpoint interface device architecture utilized in multi-drop communication networks, such as the RS485 architecture, that utilizes control logic software/firmware within the endpoint microprocessor to isolate shorted lines from the communication transceiver, and to communicate status information to a first or second data source.

6 Claims, 18 Drawing Sheets

SYSTEM AND METHODS OF RESTORATION FOR MULTI-DROP COMMUNICATION ARCHITECTURES AFTER SHORT CIRCUIT EVENT

BACKGROUND OF THE INVENTION

1. Field of the Invention

The invention relates to communication network systems, and more particularly, to multi-drop communication architecture network systems, such as RS485 multi-drop communication architecture.

2. Description of the Prior Art

Computer networks are communications systems that allow multiple computers and devices to be interconnected by communications channels that facilitate communication and allow sharing of resources and information among interconnected devices. The information that is shared over a computer network may be represented in a range of logical representations that differ in complexity. The Open Systems Interconnection model (OSI model) is a way of sub-dividing a communications system into smaller parts called layers. Similar communication functions are grouped into logical layers. For example, the lowest layer, known as the physical layer, defines electrical and physical specifications for devices. In particular, the physical layer defines the relationship between a device and a transmission medium, such as a copper or optical cable.

One particular physical layer standard is known as RS-485. RS-485 is a Telecommunications industry Association (TIA)/Electronics Industry Association (EIA) standard for multipoint communications and defines the electrical characteristics of drivers and receivers for use in balanced digital multipoint systems. RS-485 is formally known as TIA/EIA-485-A (2003) and is incorporated herein by reference in its entirety. RS-485 communication is known as half-duplex, meaning that a data source device either "talks" (transmits) or "listens" (receives/monitors) a signal, but does not do both at the same time. The RS-485 standard supports several types of connectors and enables configuration of inexpensive local networks and multipoint communications links. In a multi-drop configuration, one driver is connected to, and transmits on, a "bus" of receivers, where all of the receiver components are connected to a single set (e.g., a twisted pair) of electrical wires or connectors. In multipoint networks, such as with RS-422 communication for example, multiple drivers and receivers are each connected on a single bus where any node can simultaneously transmit or receive data over multiple sets of electrical wires or connectors (e.g., two twisted pairs of wires). By utilizing a differential balanced line over twisted pair, RS-485 networks can span relatively large distances—up to 4,000 feet. The RS-485 technical standard specifies three connector pins: a first pin carries an inverting signal (−), a second pin carries a non-inverting signal (+), and a third pin carries a common reference signal or ground. Other physical layer standards operate in a similar manner.

An RS-485 network is typically configured in a master-slave arrangement that includes at least one master data source device and a plurality of slave endpoint devices. Examples of data source devices include computers, network servers, and control devices having a computer processor and the ability to receive and transmit data. Endpoint devices include data loggers, access control panels and card readers, alarm system components, climate control panels, pay stations, sensors, additional computers, and the like. The data source device(s) may control, communicate data to, and/or receive data from each endpoint device. RS-485 communication enables multipoint connection of typically up to thirty-two, sixty-four, one hundred twenty-eight, and two hundred fifty-six transmitters, and up to thirty-two, sixty-four, one hundred twenty-eight, and two hundred fifty-six receiver devices.

RS-485 networks configured to have redundancy have at least two master data source devices. As illustrated in in FIG. 1, a traditional single-string redundant RS-485 network 20 includes a first data source device 22, a second data source device 24, and a plurality of endpoint devices 26a-26d. Each endpoint device contains two endpoint interfaces 28, 30, one for each data source device 22, 24. Each endpoint interface 28, 30 is electrically connected to a data source device. Data redundancy is provided to each endpoint device 26 on the RS-485 network 20 by duplicating hardware (i.e. cabling, and endpoint interfaces) that creates separate communication paths for endpoint data.

Another technical standard is the RS-422 standard, which can communicate in full-duplex or half-duplex modes. RS-422 is formally known as TIA/EIA-422-B (2000) and is incorporated herein by reference in its entirety. A full-duplex communication protocol uses four signal pins (two inverting (−), two non-inverting (+)) plus a ground pin. In RS-422 communication, a data source device may both transmit and receive at the same time due to the extra set of pins that carry additional inverting and non-inverting signals. Thus, one pair of pins carries a transmit signal while the other pair of pins carries a receive signal. This is different from RS-485 communication, in which a data source device can either transmit or receive, but cannot do both at the same time. RS-422 communications enable multipoint configuration of typically up to five transmitters and up to ten receiver devices.

For some applications, endpoints may be located in different spaces and floors of a factory, building, or ship where the use of a single string may not be practical. In these arrangements multiple strings are utilized in order to manage overall cable lengths. For example, a traditional multi-string redundant RS-485 network 40, as seen in FIG. 2, includes a first data source device 42, a second data source device 44, and a plurality of endpoint devices 46a-46h. Each endpoint device contains two endpoint interfaces 48, 50, one for each data source device 42, 44 with each of the two endpoint interfaces 48, 50 being electrically connected to the respective data source device 42, 44. Endpoint devices 46a-46d (e.g., located on a first floor of a building) are connected to first data source device 42 via interfaces 48a-48d, respectively, as part of a first string 43a. Endpoint devices 46a-46d are also connected to second data source device 44 via interfaces 50a-50d, respectively, as part of a second string 43b. Similarly, endpoint devices 46e-46h (e.g., located on a second floor of a building) are connected to first data source device 42 via interfaces 48e-48h as part of a third string 45a. Endpoint devices 46e-46h are also connected to second data source device 44 via interfaces 50e-50h as part of a fourth string 45b.

SUMMARY OF THE INVENTION

Unfortunately, the above-described conventional redundant network architectures have deficiencies. For example, by merely duplicating hardware in the form of additional cabling and endpoint interfaces for each endpoint, the implementation cost of setting up a redundant network can become quite expensive. This problem is further magnified when multi-string architectures are used for widely distributed endpoints because the total length of needed additional cabling is even greater.

Another deficiency of the above-described conventional redundant network architectures is that multiple endpoint interfaces per endpoint device may give rise to network installation errors. For example, during installation a technician may inadvertently plug a particular network cable into the wrong endpoint interface of a particular endpoint device. Due to the multipoint arrangement of endpoints, a single installation error of this type could destroy redundancy and/or disrupt network communications altogether.

In contrast to the above-described conventional redundant RS-485 architectures, the present invention is a serial wrap-around system with signal correction circuitry, short circuit protection, and isolation circuitry. The serial wrap-around system of the present invention utilizes communication logic and calibration software to ensure correct wiring configurations of the system within the data source device software. The serial wrap-around system of the present invention also utilizes calibration software in the endpoint devices, additional software, and hardware to perform testing of the network system wiring for both open circuit and short circuit detection. Additionally, the serial wrap-around system of the present invention utilizes wrap-around connections to endpoint devices to provide redundancy. These wrap-around connections provide redundancy without the added duplication of cabling and endpoint interfaces. By removing the need for additional cabling and endpoint interfaces, and providing for calibration and wiring correction software, the cost of installing and maintaining a RS-485 network is greatly reduced.

One embodiment of a serial wrap-around redundancy system of the present invention is provided in FIG. 3, and is directed to a network system, 60, having a first data source device, 62, with a primary interface, 70. The system, 60, also includes one or more second data source device(s), 64, having a secondary interface, 76, and which is disposed in electrical communication with the first data source device, 62. A common data source is disposed in communication with the first data source device and each additional or second data source device. The system also includes a serial string, 100, having a serial backbone electrically connected to the primary interface of the first data source device, 62 and to the secondary interface of a second data source device, 64. At least one endpoint device, 66, is electrically connected to the serial backbone via an endpoint interface, 68. The primary interface is constructed and arranged initially as a master communication source for the serial string. The secondary interface is constructed and arranged to monitor messages transmitted by the primary interface and to take over as the master communication source for the serial string connected thereto if the secondary interface does not detect messages from the primary interface after a predetermined amount of time. The data sources 62, 64 communicate to a common data source 300, in this case, a senior network system 300, through which they send and receive communications from the endpoint devices and provide status information on the communications to the endpoint devices.

It is to be understood that while this description utilizes the RS485 multi-drop communication architecture as illustrative of similar multi-drop communication architecture issues, the invention is applicable to all multi-drop communication architectures.

In the examples of the prior art discussed above and known, loss of communications from an open circuit are corrected by either redundant RS485 multi-drop network architectures as illustrated in FIGS. 1 and 2 of the prior art, or by solely utilizing the wrap around architecture and techniques as illustrated in FIG. 3 (absent the additional features shown in FIG. 3 which are unique to the present invention). Neither of these architectures are individually able to provide protection from a short circuit in the interconnecting wiring, or from damage to an endpoint device that effectively results in the loss of integrity of the multi-drop communication network.

In contrast to the above-described conventional redundant RS-485 architectures, and the serial wrap-around architecture, both types of which can only operate and recover from an open circuit failure, the proposed innovation provides a methodology and system by which multi-drop communication architectures, including the RS485 architecture, can recover and operate from an open circuit failure, a short circuit failure, a mis-wiring failure, and the total loss of an end-point.

The present invention is an endpoint device architecture utilized in multi-drop communication networks, such as the RS485 architecture, that provides protection to the network from short circuits in the interconnecting communication lines, and from the total loss of an endpoint device, and from system differential pair wiring inversions on the wire connections to the end-point device. The short circuit protection innovation for multi-drop communication networks such as RS-485 multi-drop networks, employs a specially designed endpoint interface architecture, that utilizes a separated input and output wiring arrangement for the multi-drop connection, rather than the normally tied together common connection architecture for multi-drop communication architecture endpoint; employs monitoring circuitry on the input communication and ground connections and the output communication and ground connections prior to normally open (NO) switches on the input and output communication lines; employs NO solid state switches on the input communication lines and the output communication lines; employs an analog-to-digital converter (ADC) to measure the impedance between all input and output communication lines, and between all input and output communication lines and ground; employs a microprocessor to control the analog to digital conversions, control the NO digital switches to maintain the switches in an open state until the impedance measurements are made, and maintain them in an open state if the monitoring determines a short; contains software to determine if the multi-drop differential signal lines are properly connected, and to correct the signal to the endpoint transceiver as necessary, and employs a microprocessor to provide fault status information to the communication transceiver(s) for sending to the primary and secondary signal sources; employs a microprocessor to close the NO switches on the communication connections that are determined to be valid. The invention also utilizes software in a first or second data source that sends out an initial and periodic wiring calibration signal that is received by the microprocessor in the endpoint interface. The microprocessor in the endpoint interface utilizes this signal to determine if the interconnecting differential pair wiring to the endpoint is correct and, if it is not, then the microprocessor corrects the signal to the endpoint transceiver. The short circuit protection innovation utilizes control logic software/firmware within the endpoint interface microprocessor to isolate shorted lines from the communication transceiver, and to communicate status information to a first or second data source.

The present invention may comprise an endpoint interface device which is associated with an endpoint device on a multi-drop communications network system. The system may also have at least one data source and a multi-drop network connection. The endpoint interface device itself may have an interconnection architecture, an isolation circuitry, and a monitoring circuitry. The interconnection architecture of the endpoint interface device may connect the multi-drop network connection to the associated endpoint device as separate input interconnecting multi-drop lines and separate output interconnecting multi-drop lines.

The interconnection architecture may have interconnection circuitry between a first interconnecting multi-drop transmit line and a first interconnecting multi-drop receiving line for each of an input multi-drop connection and an output multi-drop connection.

The isolation circuitry may be capable of disconnecting the input interconnecting multi-drop lines from the endpoint device. The isolation circuitry may also be capable of disconnecting the output interconnecting multi-drop lines from the endpoint device, individually.

The monitoring circuitry may be capable of monitoring and assessing an impedance value of each of the input and output connection lines, comparing the assessed value to a predetermined proper value, and instructing the isolation circuitry to isolate an indicated interconnecting multi-drop connection on the associated one of the input interconnection lines and the output interconnection lines.

The monitoring circuitry may also be capable of measuring and reporting an isolation event and the measured impedance values on valid interconnection multi-drop lines to the at least one data source.

TAILED DESCRIPTION OF THE PREFERRED EMBODIMENT

Redundant Wrap Around System—FIGS. 3-12

Figure 3:
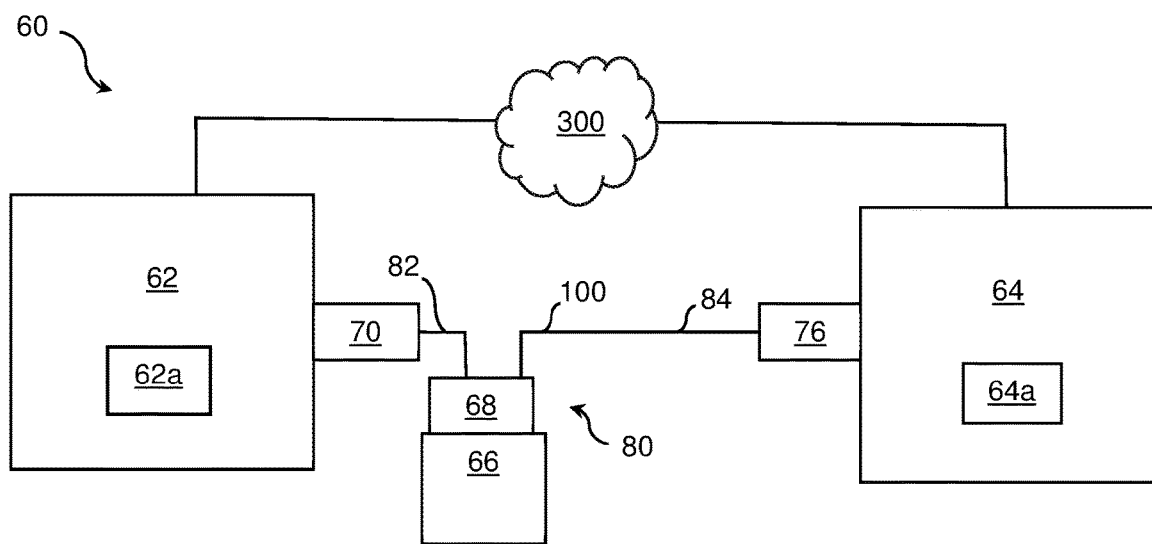
FIG. 3 is a block diagram of one embodiment of the present invention showing redundancy for a single serial string with the new interface device.

The preferred embodiments of the present invention can be used with a redundant wrap-around network system as illustrated in FIGS. 3-12. FIG. 3 shows a basic embodiment of the present invention implemented in a redundant wrap-around network system 60. System 60 has a first data source device 62, with calibration software 62a, a second data source device 64, with calibration software 64a, a serial string 80 with at least one endpoint device 66, and a common data source 300. Where the common data source 300 shown here may be a common data source hard drive device or modern common data environment, such as the cloud, which is accessible through online connections. In one embodiment, first data source device 62 has a primary interface 70 that is constructed and arranged initially as a master communication source for serial string 80. Second data source device 64 has a secondary interface 76 that is constructed and arranged to monitor messages transmitted by primary interface 70 and take over as the master communication source if secondary interface 76 does not detect messages from primary interface 70 after a predetermined amount of time.

Serial string 80 includes a backbone 100, which is a signal bus that is electrically connected between primary interface 70 and secondary interface 76. Each endpoint device 66 is electrically connected to backbone via a single endpoint interface 68 according to the present inventive method. Endpoint interface 68 employs separated input and output wiring of the invention, as shown in more detail in FIG. 4, and discussed further below. Each endpoint device 66 is connected to backbone 100 in a multipoint configuration. That is, each endpoint device 66 is connected to backbone 100, forming a serial string 80 of endpoint devices 66 connected to first data source device 62 and to second data source device 64.

Common data source 300 communicates data to first data source device 62 and to second data source device 64. Communication may be made via electrical connections or wireless communication with first data source device 62 and second data source device 64. Common data source 300 communicates information to data source devices 62, 64 so that data source devices 62, 64 know what information should be transmitted and received between first data source device 62, second data source device 64, and endpoint devices 66. The information communicated by coalition data source 300 to first data source device 62 and to second data source device 64 may be identical or it may be particular to each data source device 62, 64. When expected information is not received by second data source device 64 from either first data source device 62 and/or from endpoint device 66, for example, data source device 64 takes over as the master communication source for serial string 80.

In some embodiments, secondary interface 76 is further configured to continue monitoring messages transmitted by primary interface 70 after secondary interface 76 takes over as the master communication source. If secondary interface 76 detects reestablished communication from primary interface 70, then secondary interface 76 relinquishes control as the master communication source for serial string 80 connected thereto.

Serial string 80 has a front end 82 and a back end 84. As shown in FIG. 3, front end 82 of serial string 80 is the portion of backbone 100 that connects between first data source device 62 and the first endpoint device 66 in serial string 80 relative to first data source device 62. Back end 84 of serial string 80 is the portion of backbone 100 connected between second data source device 64 and the last endpoint device 66 of serial string 80 relative to first data source device 62.

Backbone 100 may be any suitable differential balanced line over twisted pair cables. Preferably, backbone 100 conforms to the RS-485 or RS-422 standard. Depending on application, the connectors on these cables may be of any suitable kind (e.g., screw terminals, D-subminiature connectors, etc.).

Common data source 300 is preferably a third source that is external to or separate from first data source 62 and second data source 64 as illustrated in FIG. 3. This ensures that if system 60 loses one of first data source 62 or second data source 64, the common information is not also lost. In other embodiments, common data source 300 is one of first data source 62 or second data source 64 or other data source included therein. In such an embodiment, however, loss of the data source that includes common data source results in loss of the common data as well. Thus, the system is less robust.

Figure 4:
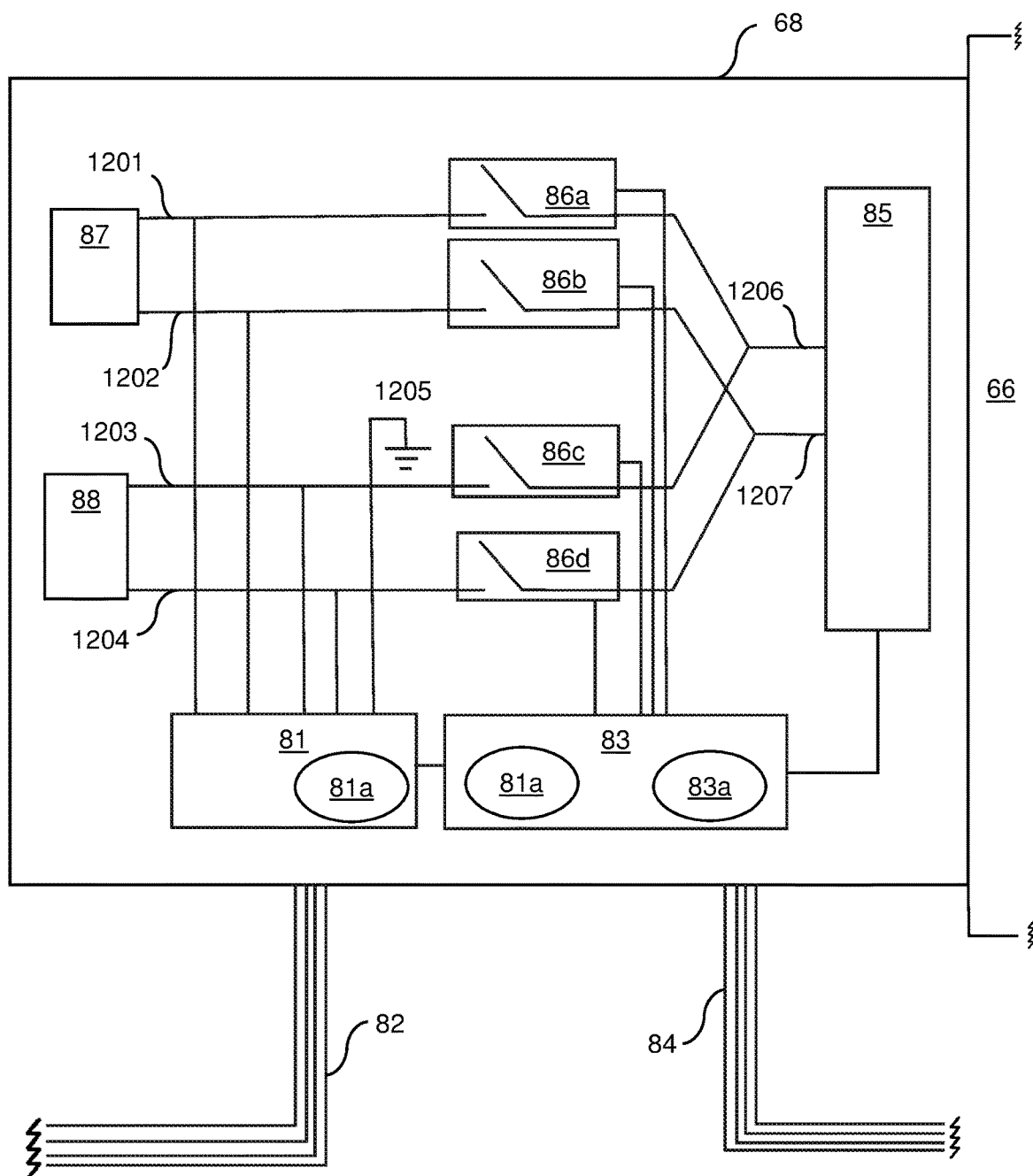
FIG. 4 is a block diagram of an end point interconnection arrangement and circuitry of a short circuit protected endpoint device according to the present invention.

FIG. 4—Short Circuit Restoration Endpoint Interface of Present System

The network system 60 of the present invention has an RS-485 multi-drop short circuit protection endpoint interface 68. This endpoint interface 68 utilizes a separated input and output wiring arrangement for the multi-drop connection to connect the endpoint devices, rather than the normally tied together common connection architecture found in prior art RS485 systems. While the current example discusses this architecture in association with the endpoint interface 68, it is to be understood that other embodiments of an RS-485 multi-drop short circuit protection network of the current invention may also employ this same architecture in each of the communication interfaces 70, 72, 74, 76 discussed elsewhere within this disclosure.

Specifically, this interface 68 employs monitoring circuitry on the input transmit (TX), receive (RX), and ground connections and the output TX, receive (RX) and ground connections. This innovation employs normally open (NO) solid state switches 86a-86d on each of the input transmit (TX) line 1201, input receive (RX) line 1202, output transmit (TX) line 1203, and output receive (RX) line 1204. An analog to digital converter (ADC) 170 is present to sense, detect, and measure the transmit (TX) and receive (RX) line impedance, convert the sensed value to a digital value, and send the converted value to the microprocessor 83. The microprocessor 83 will compare the sensed values 81a received from the ADC 81 against preset values 83a for the lines, to determine if a short condition exists on each line.

If a short circuit condition exists, the microprocessor 83 will maintain the NO digital switches 86a-86d in an open state. If the microprocessor 83 determines that a specific impedance value 81a is above the predetermined associated preset value 83a, the microprocessor 83 will close that specific NO switch 86a-86d on the transmit (TX) and/or receive (RX) lines 1201, 1202, 1203, 1204 to a closed position. The microprocessor 83 will construct a status message on the condition of the transmit (TX) and receive (RX) lines 1201, 1202, 1203, 1204. The microprocessor 83 will then provide fault status information to the primary and secondary signal sources 62, 64 on the connections that are determined to be valid via the network transceiver 85. The short circuit protection system interface 68 utilizes control logic within a microprocessor of the endpoint interface device. Other embodiments also employ additional control logic within a microprocessor in the endpoint device. The short circuit protection system interface 68 utilizes microprocessor 83 to determine when to isolate shorted lines from the RS485 transceiver 85, and to communicate status information to a first or second data source 62, 64.

Figure 1:
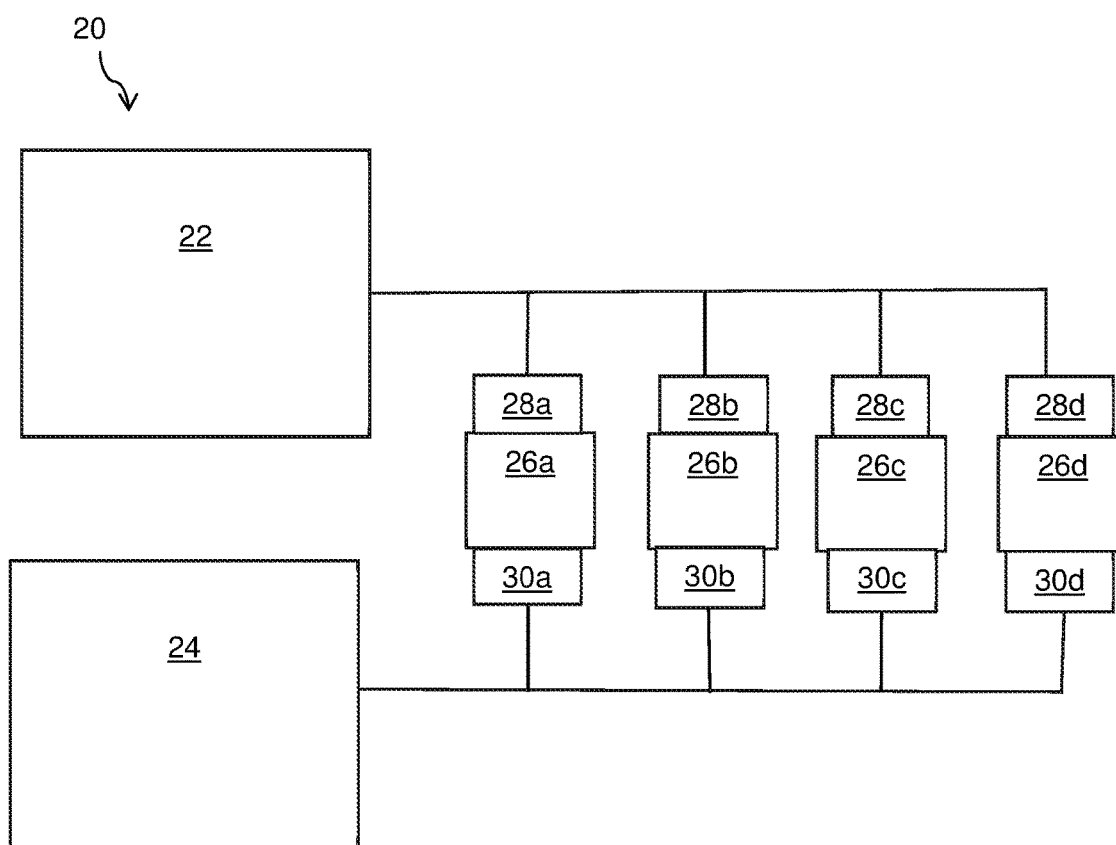
FIG. 1 is a block diagram of a single-string redundant network of the prior art.
Figure 2:
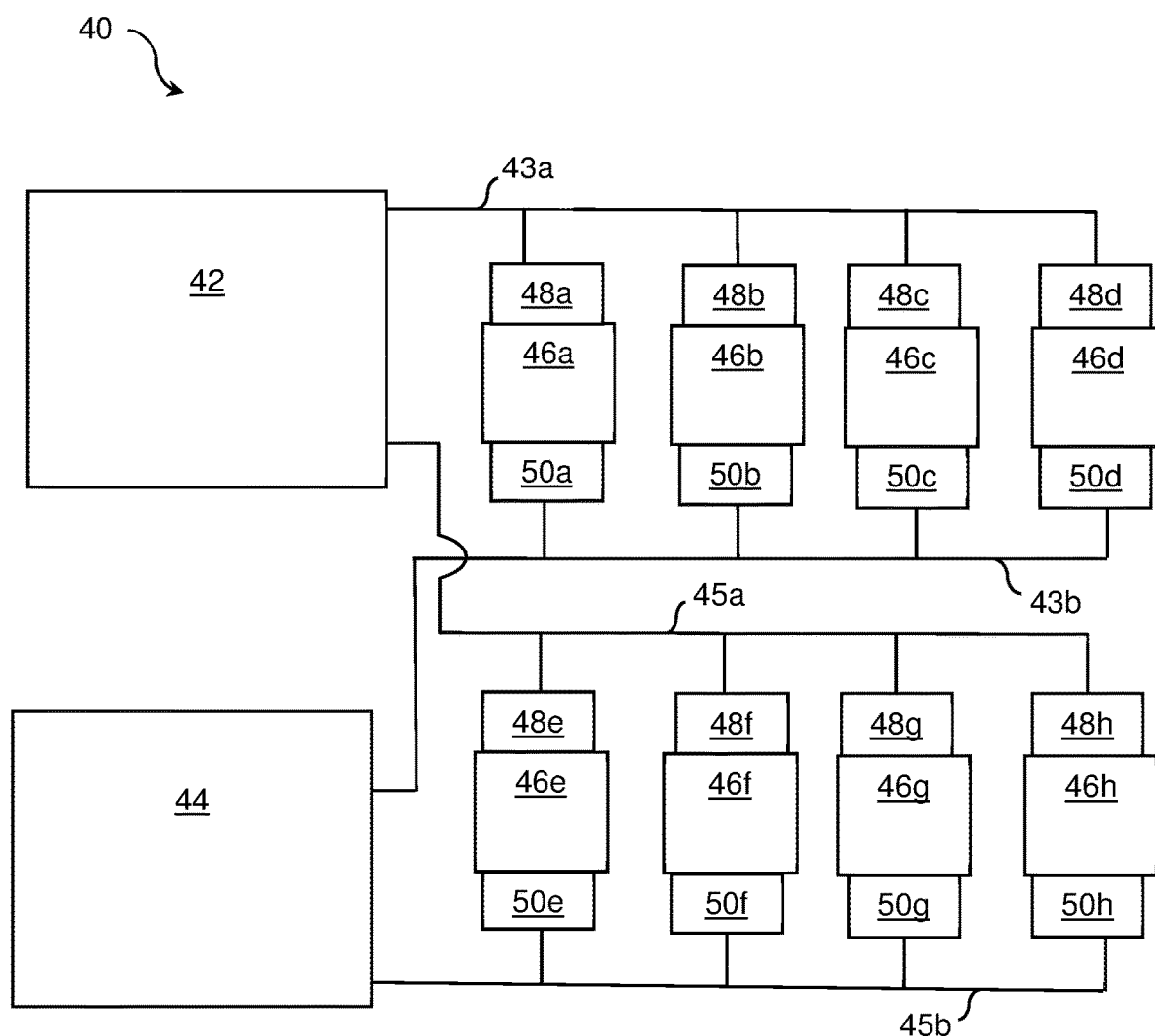
FIG. 2 is a block diagram of a multi-string redundant network of the prior art.

The preferred embodiments of the present invention of a short circuit prevention system interface 68 are illustrated in FIG. 4. Specifically, FIG. 4 illustrates the wiring arrangement and circuitry located in an endpoint interface device 68 to provide short circuit protection in either a standard redundant architecture as illustrated in FIGS. 1 and 2, if added thereto, or of a serial wrap-around architecture as illustrated in FIG. 3 as shown incorporated therein.

The short circuit protection interface 68 includes separated input, output, receiving, transmitting lines 1201, 1202, 1203, 1204. Specifically, an input transmit line 1201 is separated from an output transmit line 1203. The input transmit line 1201 is separated from the input receiving line 1202. The input transmit line 1201 is separated from the output receiving line 1204. The input receiving line 1202 is also separated from both the output transmitting line 1203 and the output receiving line 1204. Similarly, the output transmitting line 1203 is separated from the output receiving line 1204.

Each of the input and output, receiving and transmitting lines 1201, 1202, 1203, 1204 input to respective normally open (NO) switches 86a-86d. An analog to digital converter (ADC) device 81 connects to each of the input and output, receiving and transmitting lines 1201, 1202, 1203, 1204, as well as to ground 1205. A microprocessor device 83 connects to the ADC device 81, the NO switch devices 86a-d, and the RS485 transceiver device 85. As previously stated, the microprocessor device 83 generally has certain predetermined and preset values 83a,b prestored within, and is capable of receiving data 81a from the ADC device.

Figure 5:
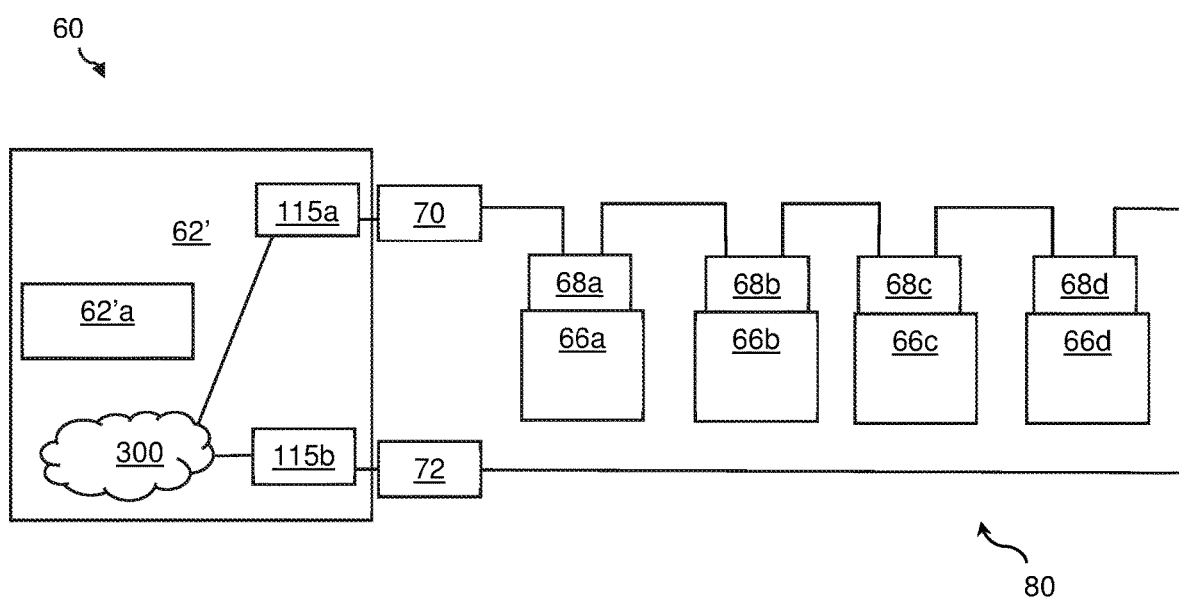
FIG. 5 is a block diagram of a single-string network employing the wiring architecture, calibration software, and the interface device of the present invention with a wrap-around connection to a second interface to a single data source.

FIG. 5—System Having a Wrap-Around Connection

Referring now to FIGS. 5-12, there are illustrated further embodiments of a redundant network system 60 employing interface devices 68 with separated wiring as illustrated in FIG. 4, and as discussed above. Referring now specifically to FIG. 5, there is illustrated an embodiment of redundant wrap-around network system 60 having a single data source device 62' with multiple transmitters 115 and calibration software 62"a. In this embodiment, data source device 62' has primary interface 70 transmitting data from first transmitter 115a. Secondary interface 72 transmits data from second transmitter 115b.

As above, primary interface 70 is constructed and arranged initially as a master communication source for serial string 80, which has endpoint devices 66a-66d with endpoint interfaces 68a-68d, respectively. Secondary interface 72 is constructed and arranged to monitor messages transmitted by primary interface 70 and to take over as the master communication source if secondary interface 72 does not detect messages from primary interface 70 after a predetermined amount of time.

In this embodiment, common data source 300 may be integral with, or external to, data source device 62'. Common data source 300 communicates with both first transmitter 115a and second transmitter 115b as described above regarding the embodiment illustrated in FIG. 3. The single data source 62' contains calibration software, 62'a. This software is used to send out a calibration message to all endpoint devices, 66a, via the interconnecting cable, and the interfaces 68, as illustrated in one embodiment in Fla 4. The endpoint devices 66 utilize this calibration message as outlined in flow chart FIGS. 14-16.

Figure 6:
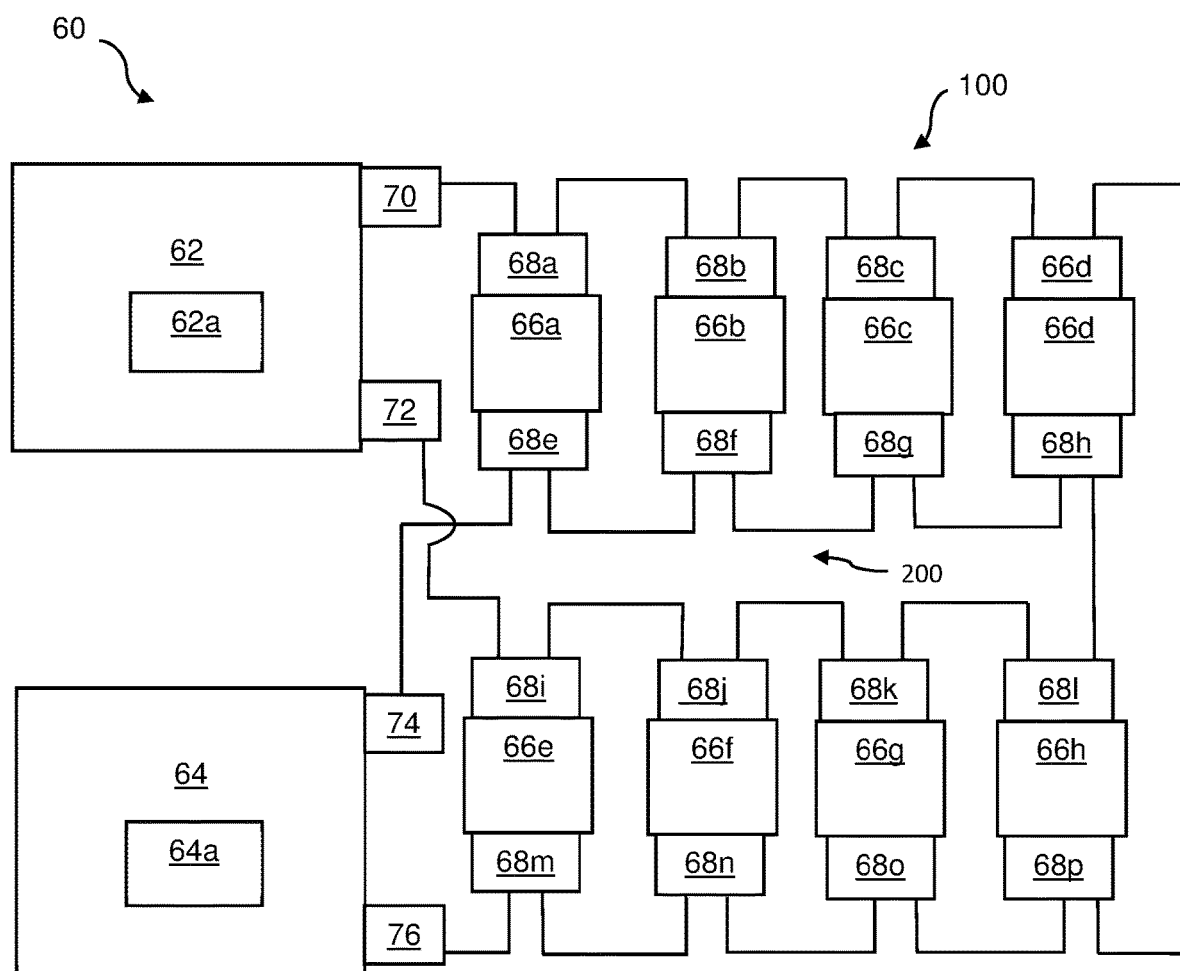
FIG. 6 is a block diagram of another embodiment of a system of the present invention of a multi-string network employing the wiring architecture, calibration software, and the interface device of the present invention with a wrap-around connection to a second interface in each data source, and with multiple data sources.

FIG. 6—System Having Multiple Data Sources

Referring now to FIG. 6, there is illustrated an embodiment of system 60 where there is illustrated a redundant wrap-around network system 60 having a first data source device 62 and calibration software 62a, and second data source device 64 with calibration software 64a. In this embodiment, data source device 62 has primary interface 70 transmitting data from data source 62 on network 100 as primary data source, and to data source 64 to secondary interface 76.

Data source 64 has primary interface 74 transmitting data from data source 64 on network 200 as primary data source and to data source 62 to secondary interface 72. Secondary interface 72 on data source 62 listens in on primary interface 74 on data source 64. Secondary interface 76 on data source 64 listens in on primary interface 70 on data source 62. As above, primary interface 70 is constructed and arranged initially as a master communication source for serial string 100, which has endpoint devices 66a-66d with endpoint interfaces 68a-68d, respectively. Secondary interface 74 on data source 64 and is constructed and arranged to monitor messages transmitted by data source 62 on interface 72 and to take over as the master communication source if secondary interface 72 does not detect messages from primary interface 74 after a predetermined amount of time. The data sources 62 and 64 contain calibration software, 62a and 64a. This software is used to send out a calibration message to all endpoint devices, 66, via the interconnecting cable, and the interfaces 68, as illustrated in one embodiment in FIG. 4. The endpoint devices utilize this calibration message as outlined in flow chart FIGS. 14-16 and as discussed below.

Figure 7:
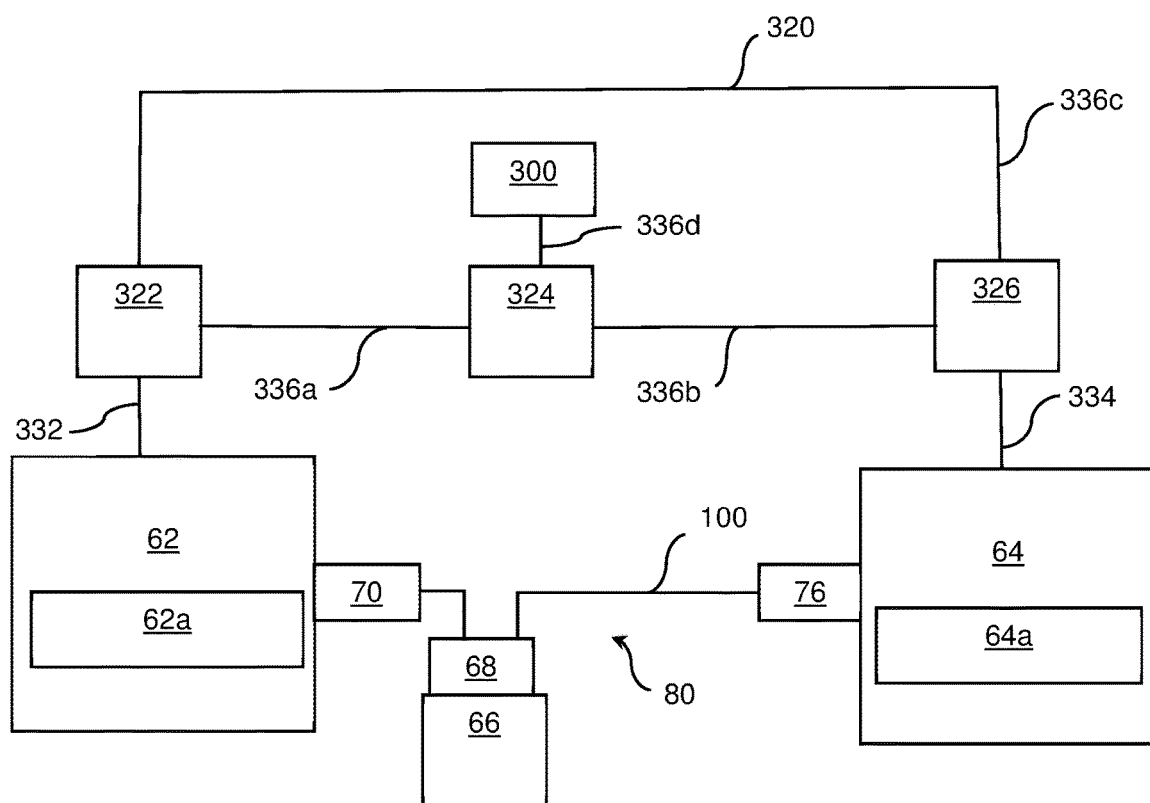
FIG. 7 is a block diagram of another embodiment of a system of the present invention showing an ethernet network connection.

FIG. 7—System Having a Second Network Switch

Referring now to FIG. 7, an embodiment of system 60 is illustrated where common data source 300 is part of an ethernet ring network 320 having a first network switch 322, a second network switch 324, and a third network switch 326. First network switch 322 connects to first data source device 62 with an ethernet downlink 332 and connects to second network switch 324 with an ethernet cable 336a. Third network switch 326 connects to second data source device 64 with an ethernet downlink 334 and to second network switch 324 by an ethernet cable 336b. First network switch 322 connects to third network switch 326 with ethernet cable 336c. Common data source 300 connects to second network switch 324 with ethernet cable 336d. Thus, first network switch 322, second network switch 324 and third network switch 326 form a ring or loop with common data source 300 connected to second network switch 324.

In the embodiment illustrated in FIG. 7, loss of first data source 62 or second data source 64 does not result in loss of common data source 300. Here, for example, loss of first network switch 322 would initially result in loss of communication from common data source 300 to first network switch 322 and therefore to endpoint device 66. Upon sensing this loss of communication, communication is restored when common data source 300 re-routes communication through third network switch 326 to second data source device 64 and therefore to endpoint device 66. This embodiment is more robust because it requires at least two failures for communication to be lost to endpoint device 66 from common data source 300.

Figure 8:
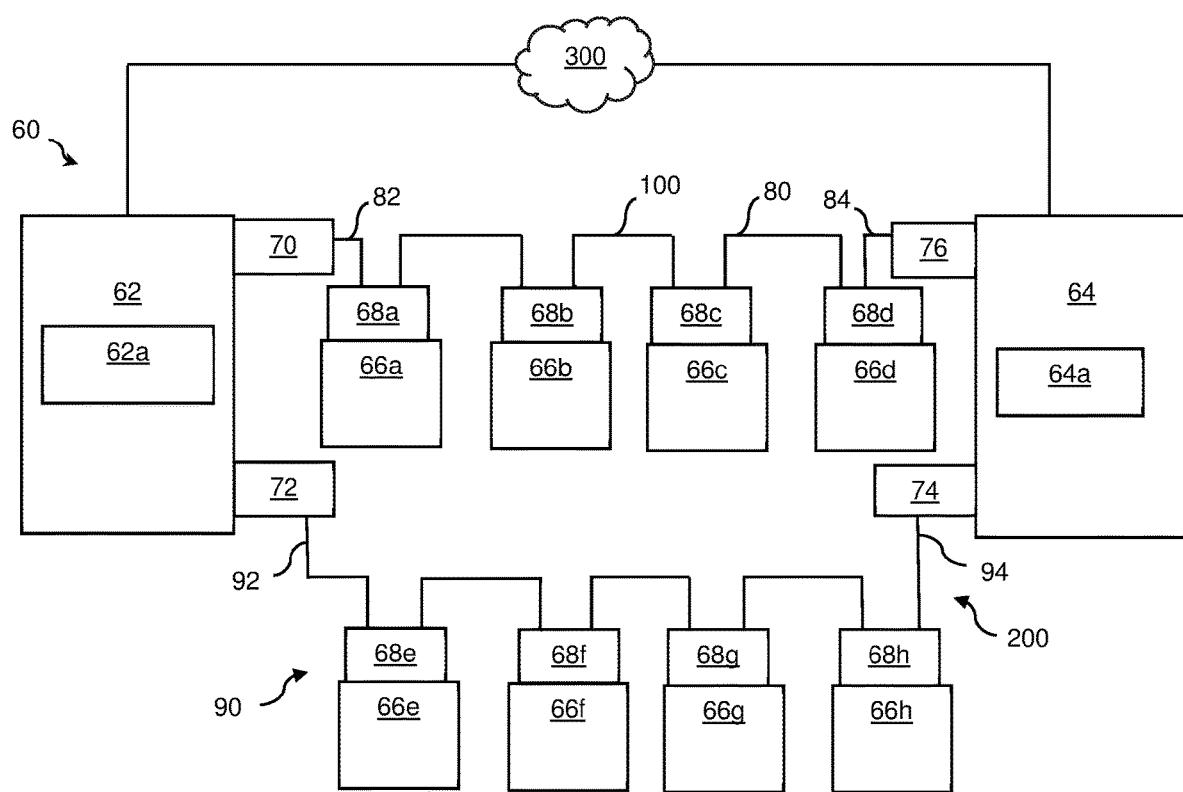
FIG. 8 is a block diagram of another embodiment of a system of the present invention showing redundancy for multiple serial strings, with multiple data sources and an ethernet network connection.

FIG. 8—System with Serial Strings

Referring now to FIG. 8, there is illustrated an embodiment of redundant wrap-around network system 60 with serial strings 80, 90. In this embodiment, system 60 has at least two serial strings 80, 90 connected between first data source device 62 and second data source device 64. System 60 optionally includes common data source 300 as described above regarding the embodiment illustrated in FIG. 3. Because the embodiment illustrated in FIG. 8 has at least two serial strings, common data source 300 may not be necessary since one of serial strings 80, 90 may serve as the common data source 300, or command device, for first data source device 62 and second data source device 64.

First data source device 62 has primary interface 70 (e.g., a first channel) and a secondary interface 72 (e.g., a second channel). Second data source device 64 similarly has a primary interface 74 and secondary interface 76. Primary interface 70 of first data source device 62 is electrically connected to secondary interface 76 of second data source device by backbone 100. Primary interface of second data source device 64 is electrically connected to primary interface of first data source device by additional or second backbone 200. At least one endpoint device 66 connects to each of backbones 100, 200 via an endpoint interface 68.

As shown in FIG. 8, endpoint devices 66a-66d connect to first backbone 100 via endpoint interfaces 68a-68d, respectively, in a multipoint configuration. Endpoint devices 66a-66d form part of first serial string 80 with backbone 100. Similarly, each of endpoint devices 66e-66h connect to second backbone 200 via endpoint interfaces 68e-68h, respectively, in a multipoint configuration. Endpoint devices 66e-66h form part of additional or second serial string 90 with second backbone 200. Endpoint devices may alternately connect to backbones 100, 200 in multipoint configuration. More or fewer endpoint devices 66 may be present on each serial string 80, 90.

As noted above, backbone 100 and second backbone 200 may be any suitable differential balanced line over twisted pair cables. Preferably, backbone 100 and second backbone 200 conform to the RS-485 or RS-422 standard. Depending on the application of system 60, the connectors on these cables may be of any suitable kind (e.g., screw terminals, D-subminiature connectors, etc.).

First data source device 62 connects to a front end 82 of first string 80 of endpoint devices 66a-66d via first primary interface 70. Second data source device 64 connects via secondary interface 76 to back end 84 of first serial string 80 of endpoint devices 66a-66d. Each individual endpoint device 66a-66d connects to first serial backbone 100 of first string 80 (and consequently to both the first data source device 62 and the second data source device 64) via the corresponding endpoint interface 68a-68d of endpoint devices 66a-66d, respectively. To eliminate connectivity errors, each endpoint device 66 preferably has no more than one endpoint interface 68.

Similarly, second data source device 64 connects via primary interface 74 to a front end 92 of second serial string 90 of endpoint devices 66e-66h via primary interface 74 of second data source device 64. Front end 92 is the portion of second backbone 200 that connects between primary interface 74 of second data source device 64 and endpoint interface 68h of endpoint device 66h, the first endpoint device in the second serial string 90 relative to second data source device 64. First data source device 62 connects via secondary interface 72 to a back end 94 of second serial string 90 of endpoint devices 66e-66h. Each individual endpoint device 66e-66h connects to second backbone 200 of second string 90 (and consequently to both first data source device 62 and second data source device 64) via the corresponding endpoint interface 68e-68h of endpoint devices 66e-66h, respectively. As similar with first string 80, to eliminate connectivity errors, each endpoint device 66e-66h of second string 90 preferably has no more than one endpoint interface 68.

In the embodiment of system 60 shown in FIG. 8, secondary interface 72 of first data source device 62 may instead be configured as a primary interface and primary interface 74 of second data source device 64 may instead be configured as a secondary interface. Thus, the primary interface of a given serial string may be assigned to either first data source device 62 or second data source device 64, where the secondary interface is assigned to the other data source device. Accordingly, for various embodiments of system 60 as illustrated in FIGS. 3-9, interfaces of first data source device 62 (or second data source device 64) may be configured as all primary, all secondary, or a mixture of both primary and secondary interfaces provided that the interface at one end of a given serial string is not configured with the same priority as the interface at the opposite end of the given serial string.

In the embodiment of system 60 shown in FIG. 8, first data source 62 and second data source 64 contain calibration software 62a and 64a, respectively. The calibration software is utilized to enable devices 66 to determine if there is a wiring error in the network. 100 and network 200. An embodiment of this is illustrated in flow chart FIG. 17.

In the embodiment of system 60 shown in FIG. 8 the separated wiring of the network 100 and 200 are employed by the devices 68 a, b, c, and d for network 100 and 68 e, f, g, and h for network 200 to determine if there is a short circuit in the wiring between devices 68. An embodiment of this is illustrated in flow charts FIG. 13,14,15.

Figure 9:
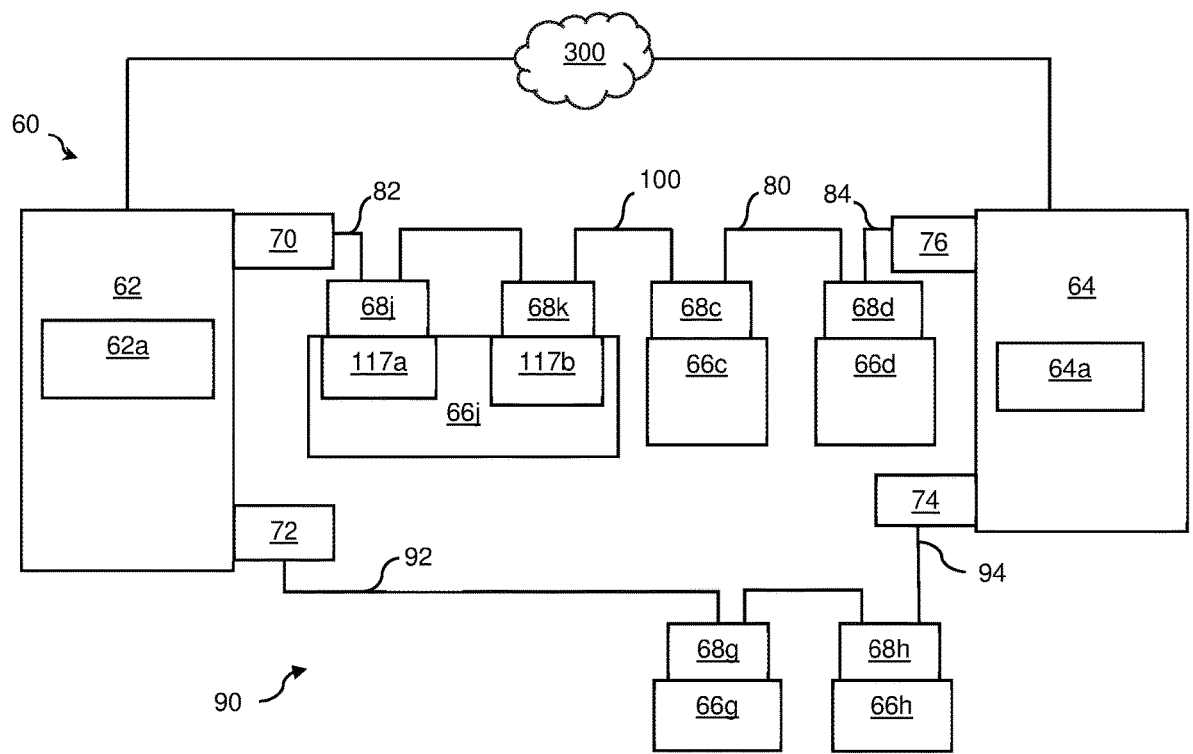
FIG. 9 is a block diagram of another embodiment of the present invention showing redundancy for a serial string having an endpoint device with multiple transmitters.

FIG. 9—System with Multiple Transmitters

Referring now to FIG. 9, an embodiment of system 60 is illustrated in which one or more of endpoint devices 66 has multiple transmitters 117. Here, for example, endpoint device 66j has first transmitter 117a and second transmitter 117b. Similar to the embodiment illustrated in FIG. 7, this embodiment of system 60 has first data source device 62, second data source device 64, first serial string 80 of endpoint devices 66, second serial string 90 of endpoint devices 66, and common data source 300. First data source device 62 has interfaces 70, 72; second data source device has interfaces 76, 74.

In this example, transmitters 117a, 117b of endpoint device 66j each have a separate endpoint interface 68j, 68k, respectively. Transmitters 117a, 117b each communicates independently with first data source device 62 and/or second data source device 64 via endpoint interfaces 68j, 68k, respectively. Endpoint device 66j therefore is configured to have internal redundancy in that each transmitter 117a, 117b transmits the identical (or at least partially identical) data from endpoint device 66j.

While example embodiments of system 60 illustrated in FIGS. 7 and 8 have two serial strings 80, 90 where each serial string 80, 90 has multiple endpoint devices 66, other arrangements are possible. Depending on the application, system 60 may have more or fewer than two serial strings and each serial string may have more or fewer endpoint devices 66. For example, a five-story office building may have the need for endpoint devices 66 on each of floors one through five. Floors one through three each have, for example, fifteen endpoint devices 66 and floors four and five each have twenty endpoint devices 66. A network designer may decide to separate endpoint devices 66 on each floor into separate strings in order to optimize the use of cabling and other hardware.

In this example, the use of five strings would require five sets of primary and secondary interfaces distributed among data source devices 62, 64. Since system 60 as illustrated in FIG. 8 already includes two primary interfaces 70, 74 and two secondary interfaces 72, 76, one on each of first data source device 62 and second data source device 64, three additional interface sets would be needed. This could be accommodated, for example, by placing two additional primary interfaces and one additional secondary interface on first data source device 62 and by placing one additional primary interface and two additional secondary interfaces on second data source device 64. This could alternatively be accommodated, for example, by incorporating one or more additional data source device and distributing the additional sets of primary and secondary interfaces between the additional data source devices.

Figure 10:
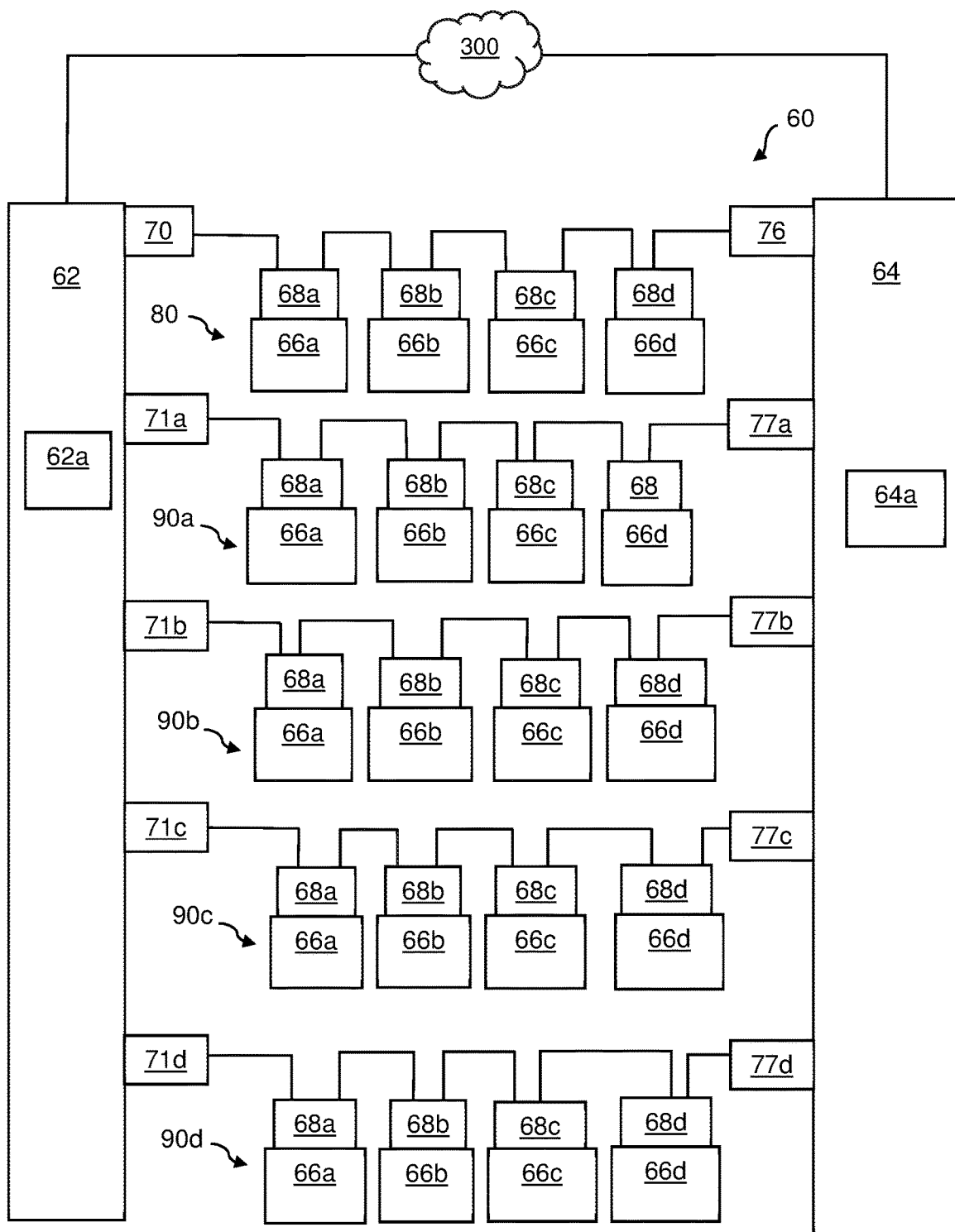
FIG. 10 is a block diagram of another embodiment of the present invention showing redundancy for multiple serial strings and an ethernet network connection.

FIG. 10—System with Multiple Serial Strings

Referring now to FIG. 10 there is illustrated an example embodiment of system 60 having a plurality of (e.g., five) serial strings 80, 90a-90d connected between first data source device 62 and second data source device 64. As shown in FIG. 10, system 60 has first serial string 80 and four additional serial strings 90a-90d. First data source device 62 has primary interface 70 that is constructed and arranged initially as a master communication source for first serial string 80. First data source device 62 also has additional interfaces 71a-71d, each configured either as primary or secondary. Second data source device 64 has secondary interface 76 and four additional interfaces 77a-77d that are each configured as either primary or secondary, depending on the configuration of the corresponding additional interface 71a-71d at the opposite end of the respective serial string. As noted above, each serial string connects to a primary interface and to a secondary interface. Thus, for example, if additional interface 71a is configured as a primary interface, then additional interface 77a is configured as a secondary interface.

Figure 11:
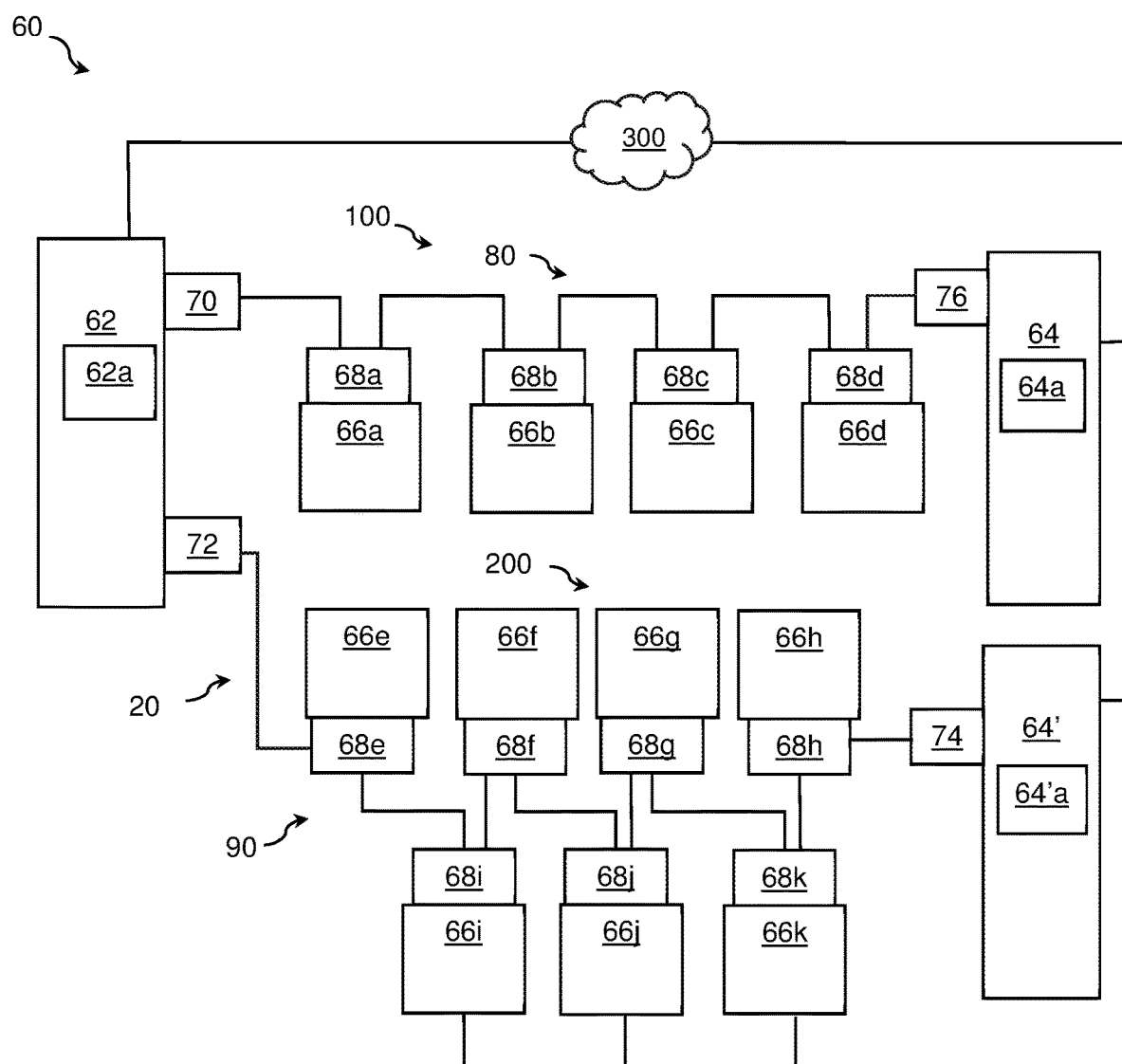
FIG. 11 is a block diagram of another embodiment of the present invention showing redundancy for multiple serial strings and using additional data source devices.

FIG. 11—System with Additional Data Sources

Referring now to FIG. 11, there is illustrated an embodiment of system 60 having additional data source devices 64', 66i-66k. In this embodiment, system 60 has first data source device 62, second data source device 64, one or more additional data source device 64', and common data source 300. One or more of serial strings 80, 90 optionally also has one or more further additional data source device 66i-66k. Common data source 300 communicates with each data source device 62, 64, 64', 66i-66k.

First serial string 80 connects between primary interface 70 of first data source device 62 and secondary data source device 76 of secondary data source device. Secondary data source device 76 takes over as the master communication source for serial string 80 should second data source device 64 fail to receive communication from endpoint devices 66a-66d and/or first data source device 62 within a predetermined amount of time. Thus, redundancy of data communicated to/from first data source device 62 on backbone 100 is provided by second data source device 64.

Similarly, second serial string 90 connects between primary interface 74 of second data source device 64' and secondary interface 72 of first data source device 62. Secondary interface 72 of first data source device 62 takes over as the master communication source for second serial string 90 should first data source device 62 fail to receive communication from endpoint devices 66e-66h and/or second data source device 64' within a predetermined amount of time. Thus, redundancy of data communicated to/from second data source device 64 on second backbone 200 is provided by first data source device 62. (As noted above, the priority of interfaces 72, 74 may be reversed where interface 72 is a primary interface and interface 74 is a secondary interface and redundancy is provided by first data source device 62.)

In addition to the redundancy provided by first data source device 62 for second serial string 90, for example, one or more further additional data source devices 65 may be connected to backbone 200. As illustrated in FIG. 11, for example, system 60 has further additional data source devices 66i, 66j, 66k with endpoint interfaces 68i, 68j, 68k, respectively. Each of the endpoint interfaces 68i, 68j, 68k of further additional data source devices 66i, 66j, 66k, respectively, are configured as secondary interfaces that listen for data communicated along backbone 200. If any of further additional data source devices 66i, 66j, 66k fail to receive data transmitted on backbone 200, due to a break in second backbone 200, for example, each of further additional data source devices 66i, 66j, 66k is configured to take over as the master communication source for second serial string 90.

As an example, if second backbone 200 failed on both sides of endpoint devices 66f and 66g, therefore cutting off communication from endpoint devices 66f, 66g to either first data source device 62 or additional data source device 64', one or more of further additional data source devices 66i, 66j, 66k is configured to take over as the master communication source for these endpoint devices 66f, 66g. If more than one further additional data source device 66i, 66j, 66k is able to take over as the master communication source, the first further additional data source device 66i, 66j, 66k to do so would become the master communication source.

In the various embodiments of system 60, an additional or second data source device is configured to take over as the master communication source after a predetermined amount of time elapses without receiving or detecting a signal. The predetermined amount of time is a function of the type of the distribution and control implemented by system 60. When system 60 requires real-time control of endpoint devices 66, the predetermined amount of time is set where a secondary data source device takes over as soon as possible. In another system 60, such as control of lighting, where a single "on" or "off" signal changes the state of the lighting to either on or off, the predetermined amount of time may be set to allow for a reasonable or acceptable delay in the lighting to respond to the change-of-state command.

Figure 12:
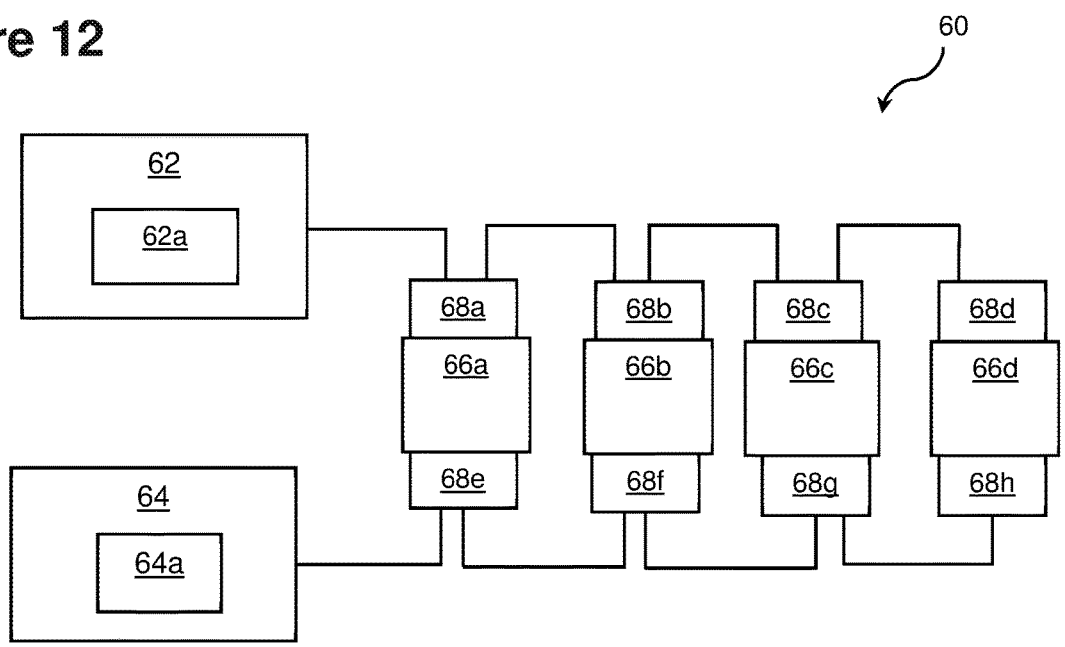
FIG. 12 is a block diagram of a single-string redundant network employing the wiring architecture, calibration software, and the interface device of the present invention.

FIG. 12—System with Dual Data Sources

Referring now to FIG. 12 is a further embodiment of a redundant network system 60 employing interface devices 68 with separated wiring as illustrated in FIG. 4, and as discussed above. Specifically, the embodiment shown in FIG. 12 has a network system 60 that employs separated wiring for input and output to interface devices 68. This network system also has dual data sources 62 and 64, with calibration software 62a and 64a. In this embodiment, the calibration software 62a, 64a is used to determine if there are wiring errors in the network 60 as provided in one embodiment in flow charts FIG. 14, and FIG. 15. Interface devices 68 are illustrated in one embodiment in FIG. 4. Interface devices 68 employ one embodiment of a method to determine if a short condition exists as provided in FIG. 16.

Methods of Operation of Short Circuit Event Restoration—FIGS. 13-18

The method of operation of the present invention is discussed with reference to FIG. 13-18, and particularly the interface shown in FIG. 4. During normal operations, the endpoint interface, shown in FIG. 4, has an analog to digital converter (ADC) device 81 which constantly and continuously measures the impedance between the input transmit (TX) line 1201 and the input receive (RX) line 1202. The ADC 81 also measures the impedance between the input transmit (TX) line 1201a and the ground 1205, as well as between the input receive (RX) line 1202a and the ground 1205. The ADC device 81 reports the measured impedance values 81a, measured from each of these lines, to the microprocessor device 83.

The microprocessor device 83 receives and evaluates the impedance values measured by the ADC device 81. Specifically, the microprocessor device 83 compares the measured impedance values 81a with the stored preset values 83a. Based upon the outcome of that evaluation, the microprocessor device 83 will act in either one of two ways.

First, if the impedance measured value 81a is below the preset value 83a, then the microprocessor device 83 does not close the analog switch devices 86a-d on the lines that have impedance values below the preset level (as shown in FIG. 4). That is, as previously stated, the analog switches 86a-d are normally open (NO) switches. Their normal state during operation is in an open state.

Figure 14:
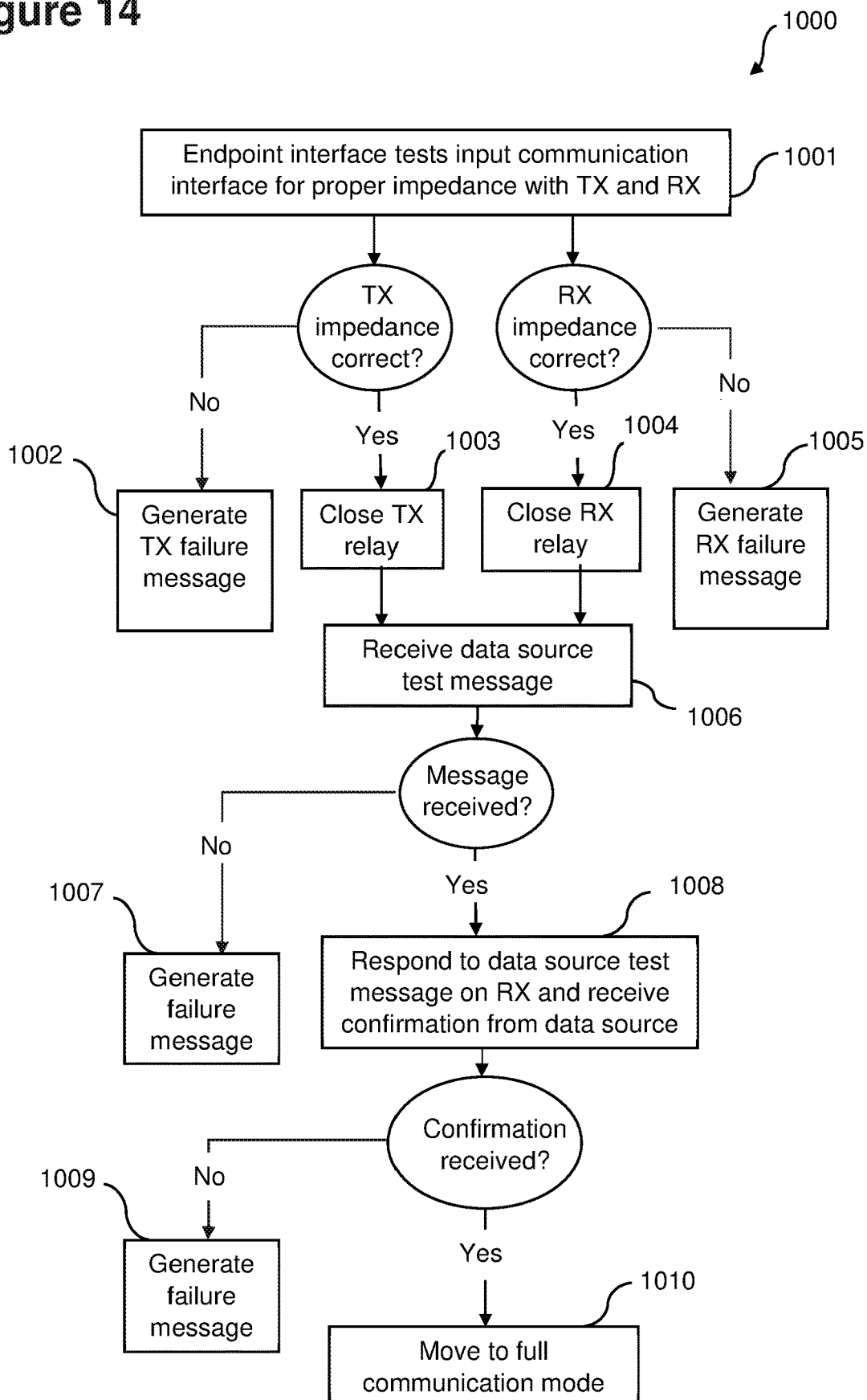
FIG. 14 is allow diagram showing steps of a method of determining of a short condition exists on the wiring connections to the end device inputs.
Figure 15:
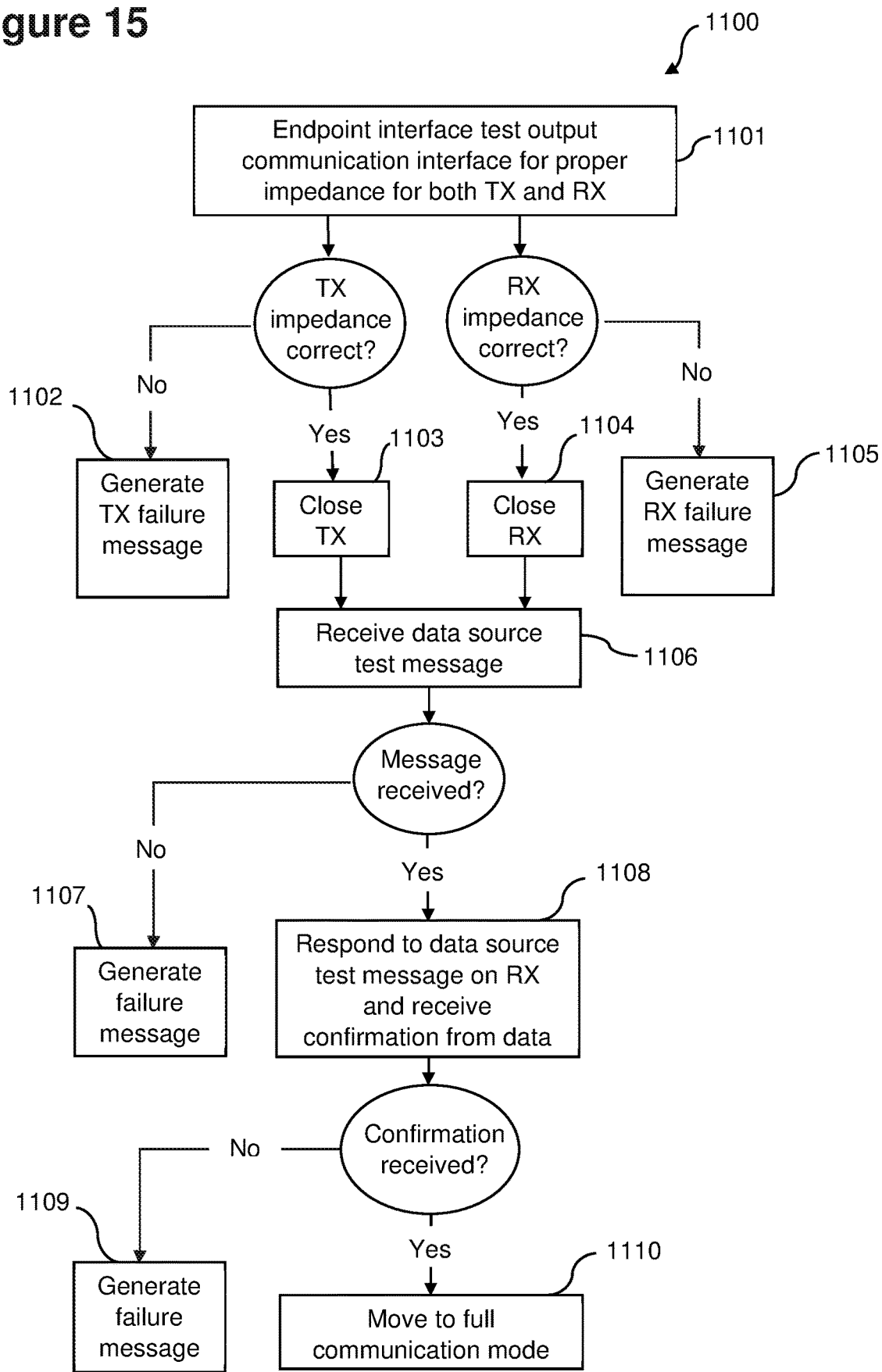
FIG. 15 is a flow diagram showing steps of an embodiment of a method of determining if a short condition exists on the output wiring connections.
Figure 16:
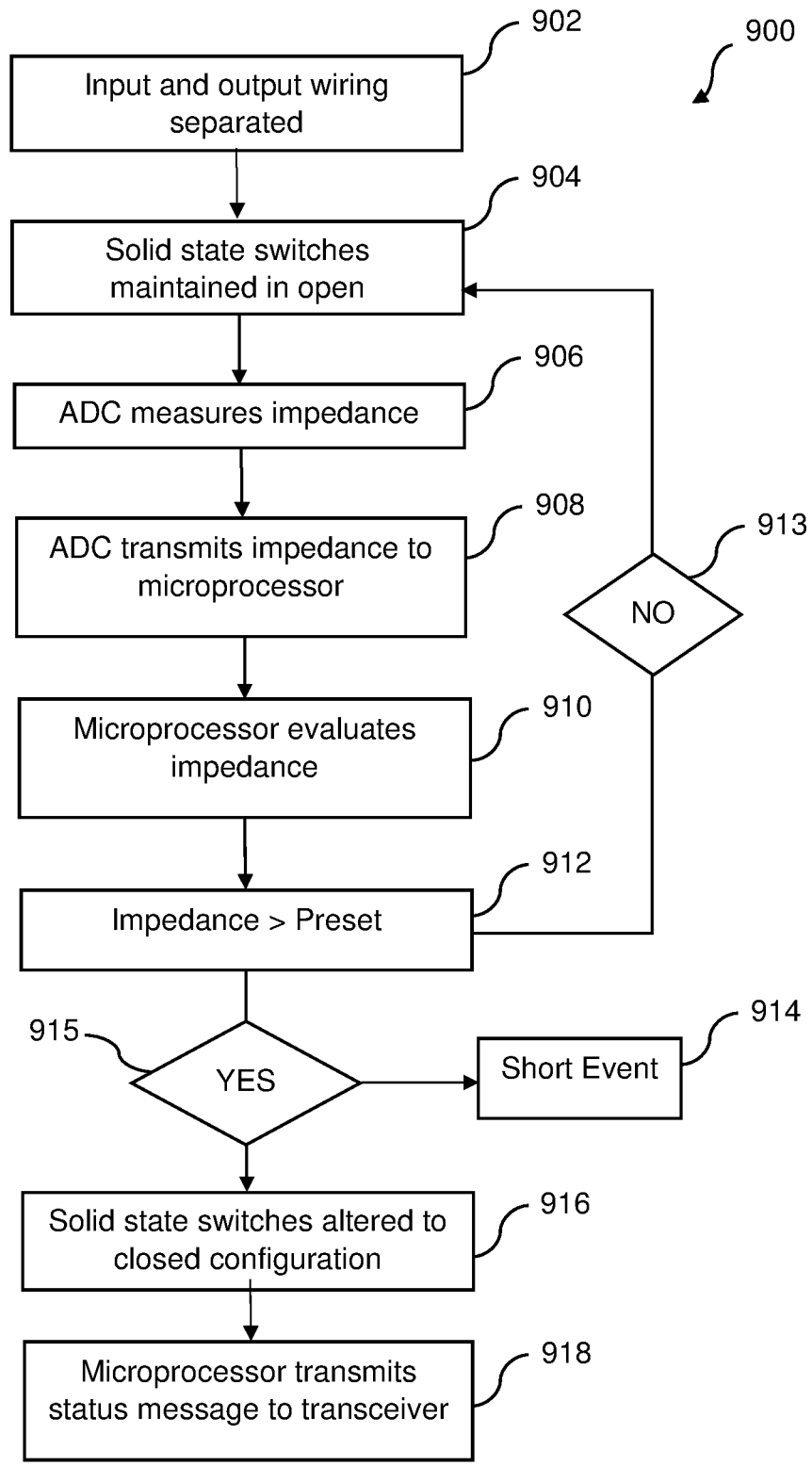
FIG. 16 is a flow diagram showing steps of an embodiment of a method of determining if a short condition exists on the wiring connections to the end device.

However, if the impedance value 81a measured by the ADC device 81 is above the stored preset level 83a, the microprocessor device 83 closes the analog switch devices 86a-d on the line 1201-1204 that has a higher measured impedance value 81a due to a short event 914 (as shown in FIG. 14-16). The microprocessor device 83 then provides a status message to the RS485 transceiver device 85 which then transmits the status message to the first data source device 62 or second data source device 64.

Figure 13:
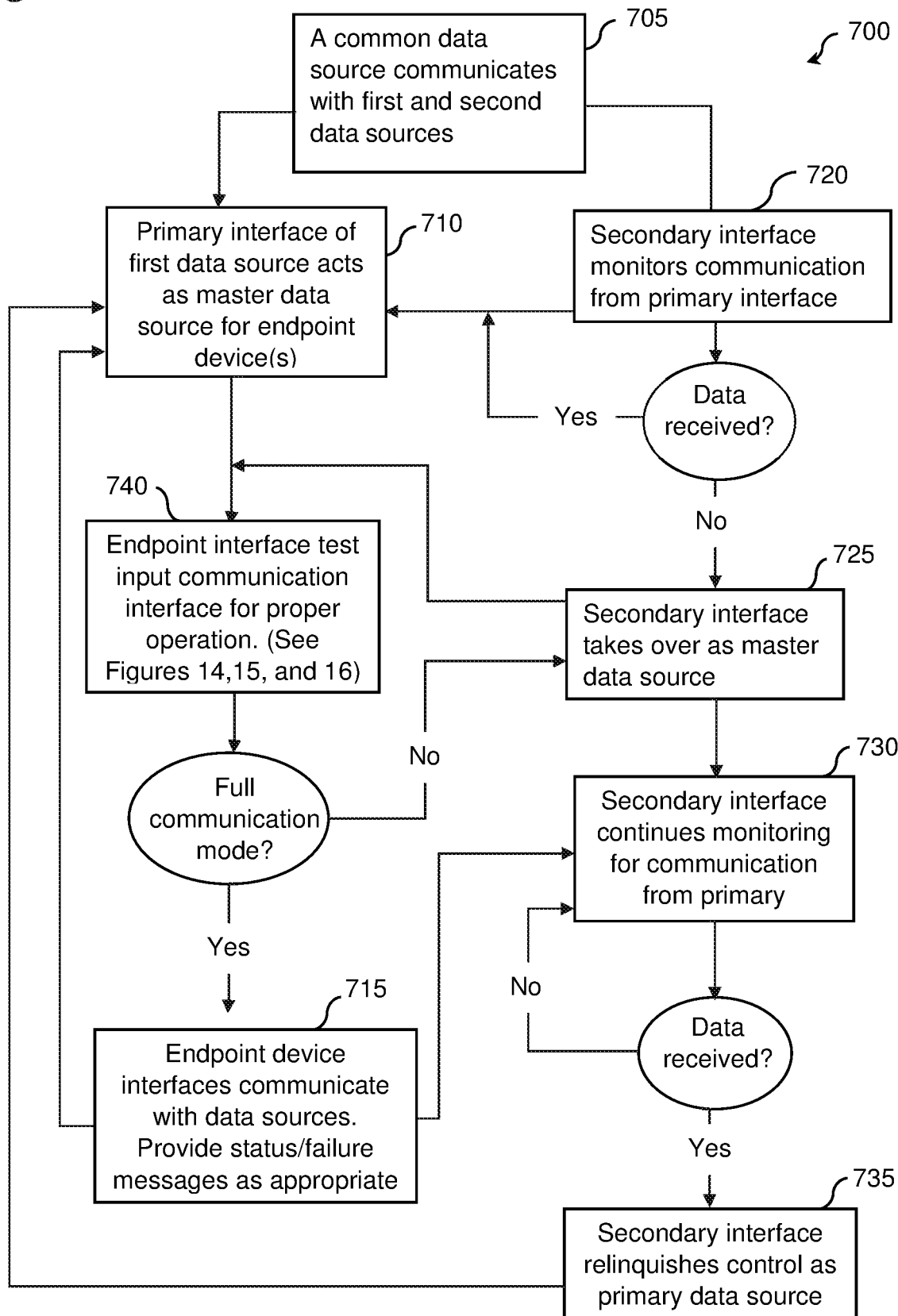
FIG. 13 is a flow diagram showing steps of an embodiment of a method of network redundancy of the present invention.

FIG. 13—Method Overview

FIG. 13 illustrates the steps of various embodiments of a method 700 of reducing faults by providing network redundancy. Initially, step 705, a common data source communicates with first and second data sources. In this method, as shown in step 710, a primary interface of the first data source acts as the master communication source for one or more endpoint devices, a master controller.

Once the master communication source has been defined, next, in step 740, the endpoint interface devices test their input connections for proper wiring and for shorts. The methods for testing these connections is further discussed below with reference to further FIGS. 14-16. Once it has been determined that there is full communication, next in step 715, each endpoint device communicates with the data sources via the endpoint interfaces. Status messages or failure messages are provided as appropriate.

In step 720, a secondary interface of another data source monitors communication from the primary interface. If communication from the primary interface is received or detected by the secondary interface as expected, the secondary interface continues monitoring communications. If communication is not received or detected by the secondary interface as expected, the secondary interface in step 725 takes over as the master data source.

If there is a communication failure after testing 740, then, step 725, the secondary interface takes over as the master data source.

Another embodiment of method 700 also includes steps 730 and 735 after the secondary interface has taken over as the master data source. In step 730, the secondary interface continues to monitor communication from the primary interface. If communication from the primary interface has been reestablished, the secondary interface in step 735 relinquishes control as the master data source. If communication has not been reestablished, the secondary interface continues to monitor communication from the primary interface for reestablished communication.

FIG. 14—Method of Determination of Short on Input Connections

Method 1000 shown in FIG. 14 provides illustration of a possible implementation of the process within an endpoint interface 68 to determine the presence of a short on the transmit (TX) and receive (RX) lines on the input communication connections to an endpoint. In this process, the endpoint interface 68 utilizes the ADC 81 and microprocessor 83 of FIG. 16 to measure the proper line impedance on the input transmit (TX) and receive (RX) lines, step 1001. If the transmit (TX) impedance measurement is higher than a preset value as measured by the ADC 81, the microprocessor 83 will close the transmit (TX) relay 86a, step 1003. Similarly, if the receive (RX) impedance measurement 81a is higher than a preset value 83a as measured by the ADC 81, the microprocessor 83 will close the receive (RX) relay 86b, step 1004. The endpoint device will stand by to receive a data source test message in step 1006. If the message is received, the endpoint device will respond to the data source test message on the receive (RX) line, and receive confirmation of the response received from the data source, step 1008.

If the data source test message is not received, the endpoint will generate a failure message in step 1007 and once communications are restored, will send the message to the data source. Once the endpoint has sent the response message to the data source, and the confirmation of the sent message received from the data source is sent, the endpoint device will move to full communication mode in step 1010. If the confirmation response is not received, the endpoint device will generate a failure message and send it once communications to the data source are established by alternate paths.

FIG. 15—Determination of Short on Output Connections

Method 1100 shown in FIG. 15 provides illustration of a possible implementation of the process to determine the presence of a short on the transmit (TX) and receive (RX) lines on the output communication connections to an endpoint. In this process, the endpoint interface 68 utilizes the ADC 81 and microprocessor 83 of FIG. 16 to measure the proper line impedance on the input transmit (TX) and receive (RX) lines, step 1101. If the transmit (TX) impedance measurement is higher than a preset value as measured by the ADC 81, the microprocessor will close the transmit (TX) relay 86c in step 1103, and similarly, if the receive (RX) impedance measurement is higher than a preset value as measured by the ADC 81, the microprocessor 83 will close the receive (RX) relay 86d in step 1104.

The endpoint device will standby, waiting to receive a data source test message in step 1006, and if the message is received will respond to the data source test message on the receive (RX) line and receive confirmation of the response received from the data source in step 1108. If the data source test message is not received, the endpoint interface 68 will generate a failure message in step 1107 and once communications are restored, will send the message to the data source. Once the endpoint interface 68 has sent the response message to the data source, and the confirmation of the sent message received from the data source is sent, the endpoint device will move to full communication mode in step 1110. If the confirmation response to this is not received, the endpoint interface device 68 will generate a failure message and send it once communications to the data source are established by alternate paths.

FIG. 16—Method of Reaction to Short Circuit Event within Interface

Specifically, in FIG. 16, the method of the present invention described partly above is shown in block diagram form during the presence of a short circuit event 914. Such a short circuit event 914 could be due to a line coming into contact with either a neutral wire or grounded portion of the system due to damage, age, or other factor, etc. In this instance, the short circuit event 914 effects the impedance between the input transmitting (TX) line 1201 and input receiving (RX) line 1202 of interface 68 (see FIG. 4). The ADC device 81 measures the effected impedance between the input transmit (TX) line 1201 and input receive (RX) line 1202. The ADC device 81 reports the measured impedance value 81a to the microprocessor device 83.

In FIG. 16, the microprocessor device 83 receives and evaluates the impedance value 81a measured by the ADC device 81. The microprocessor device 83 compares the measured impedance value 81a with the stored preset value 83a. Since the impedance value 81a measured by the ADC device 81 is above the stored preset level 83a, the microprocessor device 83 closes the analog switch devices 86a-d on that line. The microprocessor device 83 then provides a status message to the RS485 transceiver device 85 which then transmits the status message to the first data source device 62 or second data source device 64.

In this embodiment, these actions are configured to be performed independently by every endpoint interface 68 on the RS485 network. In this manner, a short in the interconnecting wiring between any two endpoint interface devices 68, 68' on the RS485 network will be isolated from the endpoint RS485 transceiver 85, and the endpoint RS485 transceiver 85 will be able to restore communications with its first or second data source utilizing the interconnection transmit (TX) and receive (RX) lines that are not shorted, after the microprocessor device 83, closes the NO switches, devices 86a-86d that have impedance measurements 81a above the prescribed value 83a that indicate a non-shorted line connection.

If the inventive concept for an RS485 architecture utilizes an architecture as provided in FIG. 1 or FIG. 2 of the prior art, then communications on the first or second data source 62, 64 will be restored to those devices that are prior to the short for the first or second data source 62, 64.

If the RS485 architecture utilizes an architecture as provided in FIG. 3, then communications will be restored to those devices that are prior to the short, for the first data source 62, and will be restored to those devices that are after the short, for the second data source 64.

Figure 17:
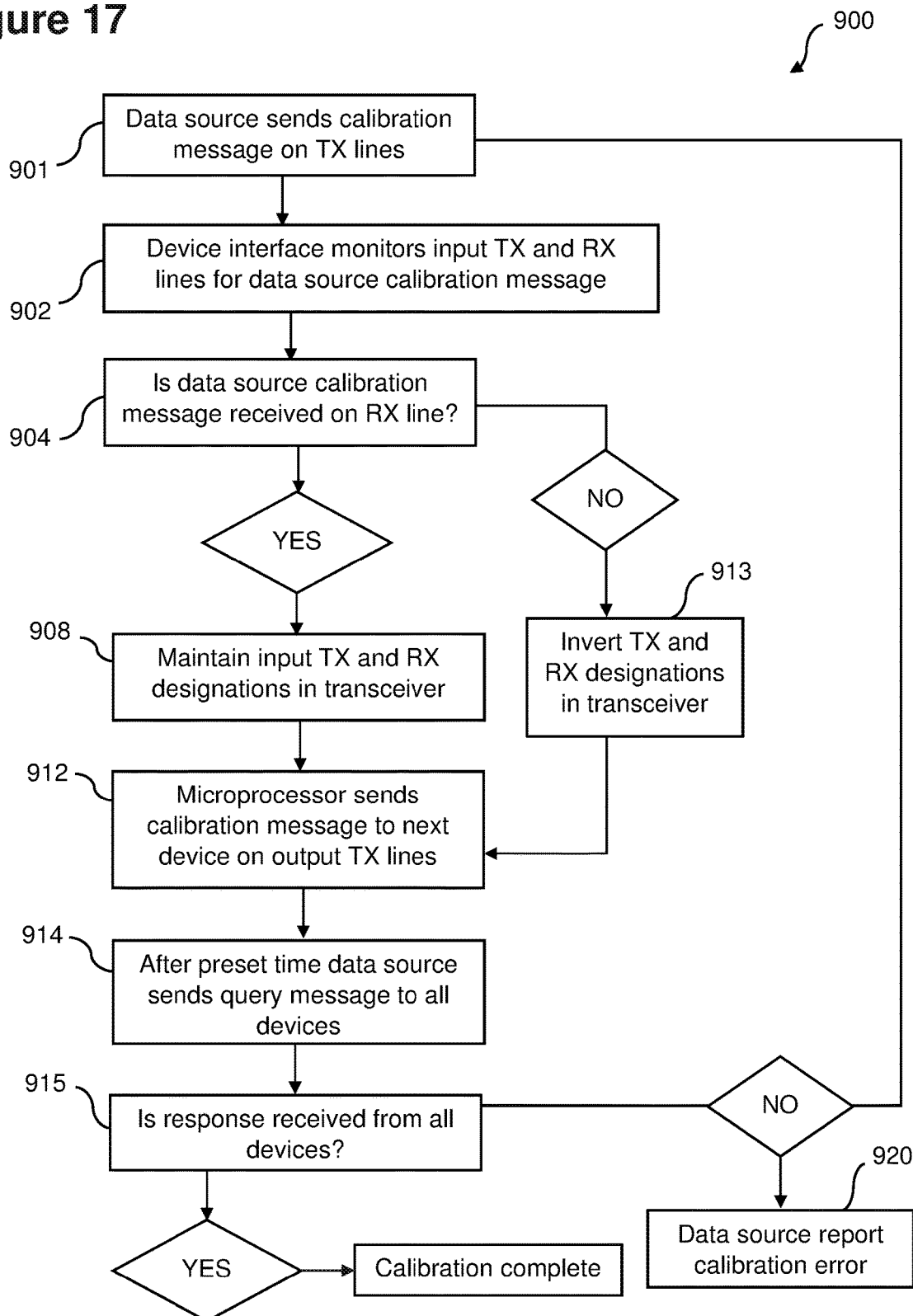
FIG. 17 is a flow diagram showing steps of an embodiment of a method of network wiring error detection and correction according to the present invention.

FIG. 17—Method of Calibration Process

Method 900 shown in FIG. 17 provides illustrations of a possible implementation of the calibration process implemented in system 60. In step 901 the primary data source sends a calibration message on the transmit (TX) lines as a first step performed on system 60 start-up. The endpoint interface device 68 monitors the input transmit (TX) and receive (RX) lines for the data source calibration message in step 902.

In step 904 the endpoint interface device 68 determines if it has received the data source calibration message on the receive (RX) line, and if it has, it maintains its transmit (TX) and receive (RX) designations in the endpoint transceiver 85, in step 908.

If the calibration message is received on the endpoint transmit (TX) line, the endpoint inverts its transmit (TX) and receive (RX) designations in the transceiver 85, step 913.

Once all calibration messages have been received and all transmit (TX) and receive (RX) lines calibrated, the data source sends out a query message to all devices to confirm proper communications with all endpoint interface devices 68, step 915.

If all endpoint interface devices 68 respond correctly, the calibration effort is complete. If not, the data source reports a calibration error, and re-starts the calibration effort, step 920.

The endpoint microprocessor resends the calibration message to the next endpoint interface device 68 on the network on its output transmit (TX) lines which are received by the next endpoint device on its input receive (RX) lines, in step 912.

In use, embodiments of system 60 provide redundancy for data source device information to endpoint devices 66 via endpoint interface devices 68. Primary interface 70 of first data source device 62 acts as the master communication source for first serial string 80 of endpoint devices 66.

Primary interface 70 is assigned priority by first data source device 62 to act as a master communication source over secondary interface 76 of second data source device 64, which acts as a slave and listens for messages transmitted by primary interface 70 of first data source device 62.

If a certain predetermined amount of time (e.g., a minute) elapses during which secondary interface 76 does not detect any messages from primary interface 70, secondary interface 76 takes over as the master communication source for first serial string 80 of endpoint devices 66, After taking over as the master communication source, secondary interface 76 continues to listen for messages transmitted by primary interface 70 of first data source device 62. As soon as primary communication is restored (i.e., secondary interface 76 detects a message from primary interface 70), secondary interface 76 ceases acting as the master communication source for first serial string 80 of endpoint devices 66 and continues to monitor messages from primary interface 70.

Similarly, primary interface 74 of second data source device 64 acts as the master communication source for second serial string 90 of endpoint devices 66. Secondary interface 72 of first data source device 62 listens for messages transmitted by primary interface 74 of second data source device 64. If a certain predetermined amount of time (e.g., a minute) elapses during which secondary interface 72 does not detect any messages from primary interface 74, secondary interface 72 of first data source device 62 takes over as the master communication source for second string 90 of endpoint devices 66.

After taking over as the master communication source, secondary interface 72 of first data source device 62 continues to listen for messages transmitted by primary interface 74 of second data source device 64. As soon as primary communication is restored (i.e., secondary interface 72 detects a message from primary interface 74), secondary interface 72 ceases acting as the master communication source for second serial string 90 of endpoint devices 66 and continues to monitor messages from primary interface 74 of second data source device.

Figure 18:
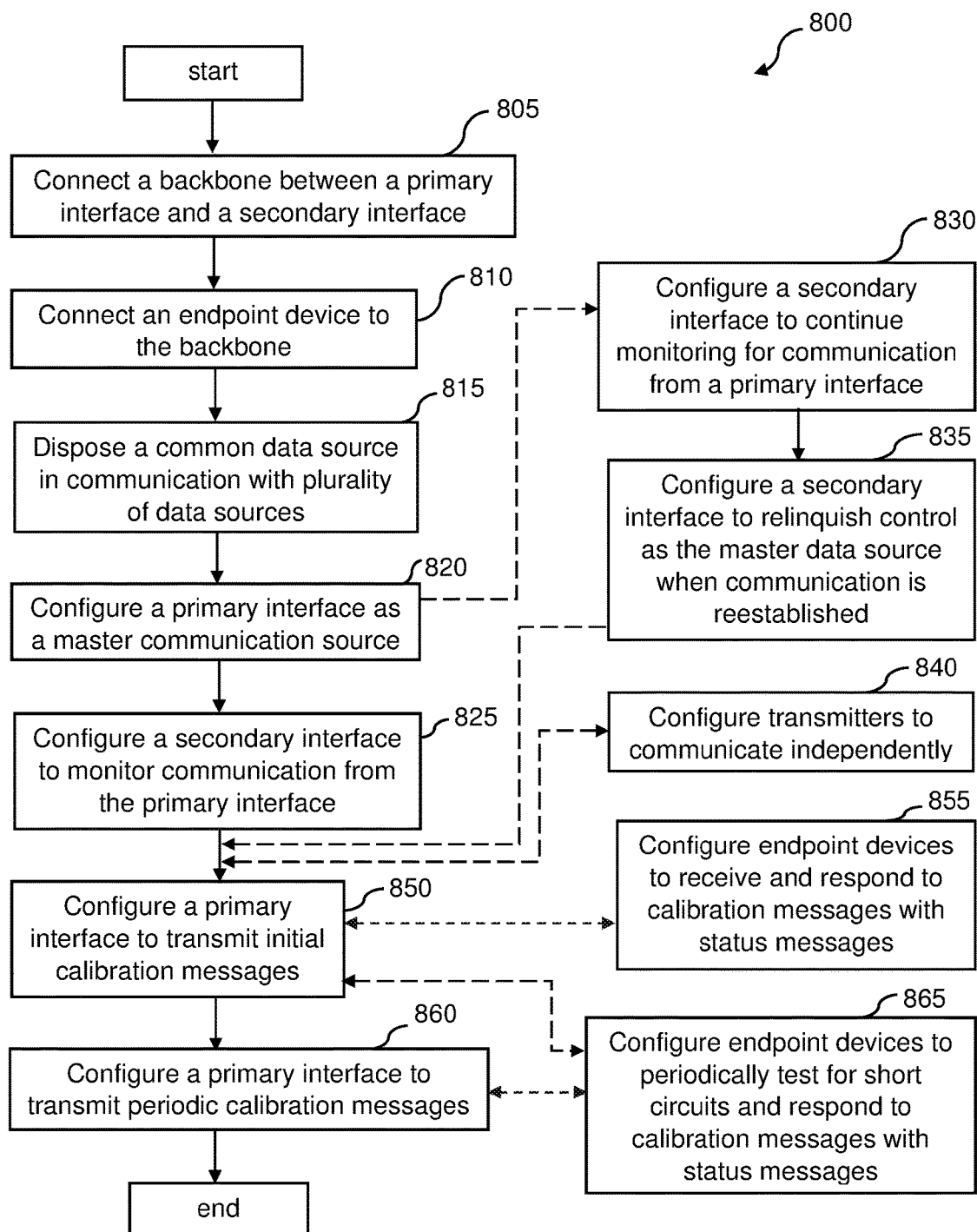
FIG. 18 is a flow diagram showing steps of an embodiment of a method of configuring a network with serial redundancy according to the present invention.

FIG. 18—Method of Configuration

FIG. 18 illustrates the steps of various embodiments of a method 800 of configuring a network with serial redundancy. Steps of method 800 do not have to be performed in the order shown and the sequence of FIG. 18 is merely illustrative. In step 805, a serial backbone is connected to a primary interface of a first data source device and to a secondary interface of a second data source device. In step 810, at least one endpoint device is connected to the backbone via an endpoint interface, forming a serial string of endpoint devices. In step 815, a common data source is disposed in communication with the first data source device and with the second data source device. In step 820, the primary interface is configured to initially act as a master communication source for the serial string of endpoint devices. In step 825, a secondary interface is configured to monitor messages transmitted by primary interface and to take over as the master communication source for the serial string of endpoint devices connected thereto if the secondary interface does not detect messages from the primary interface after a predetermined amount of time.

Another embodiment of method 800 optionally includes steps 830 and 835. In step 830, the secondary interface is configured to continue monitoring messages transmitted by, the primary interface after the secondary interface takes over as the master communication source. In step 835, the secondary interface is configured to relinquish control as the master communication source for the serial string connected thereto if the secondary interface detects reestablished communication from the primary interface.

Method 800 can be modified to include the step of configuring additional data sources and additional serial strings of endpoint devices. In one embodiment of method 800, step 805 is performed where the first data source device is connected to a front end of the backbone. In another embodiment of method 800, step 805 is performed where the second data source device is connected to a back end of the backbone. In another embodiment of method 800, the backbone is either a half-duplex serial backbone or a full-duplex serial backbone. In another embodiment of method 800, step 810 of connecting at least one endpoint device is performed by connecting the endpoint device(s) in a multi-drop or a multipoint configuration to the additional serial backbone.

In another embodiment of method 800, at least one of the endpoint devices has multiple transmitters. Method 800 optionally includes step 840 of configuring each transmitter of a single endpoint device to communicate independently with the first data source device, the second data source device, and/or any additional data source device(s).

In another embodiment of the method 800 shown in FIG. 18, the step 810 of connecting at least one endpoint device is performed by electrically connecting the endpoint device(s) by a single endpoint interface to the backbone. In another embodiment of method 800, the primary interface and secondary interface connected to a serial string of endpoint devices are both in compliance with the RS-485 technical standard or the RS-422 technical standard.

Method 800 includes the steps 850 in which the primary data interface send out calibration messages to the endpoints to verify and correct interface wiring errors that may exist on the system 60. During this calibration stage, the endpoint devices configure themselves to receive and respond to calibration messages with status information, step 855. These calibration methodologies from the primary interface are repeated periodically in step 860, during which endpoint devices are concurrently configured to test for short circuits and calibration messages and respond with status messages, step 865.

LIST OF REFERENCED ELEMENTS

The following reference numbers are adhered to within the specification to refer to those referenced elements within the drawings of the present application.
  networks 20, 40, 60
  first data source device 22
  second data source device 24
  endpoint devices 26a-26d
  endpoint interfaces 28, 30
  first data source device 42
  second data source device 44
  first string 43a
  endpoint devices 46a-46h
  two endpoint interfaces 48, 50
  first data source device 62
  calibration software 62a
  second data source device 64
  calibration software 64a
  endpoint device, 66
  endpoint interface, 68
  primary interface, 70
  secondary interface 72
  primary interface 74
  secondary interface, 76
  serial string 80
  analog to digital converter 81
  measured impedance value 81a
  front end 82
  microprocessor 83
  preset impedance value 83a
  back end 84
  transceiver 85
  switches 86
  input 87
  output 88
  serial string 90
  front end 92
  back end 94
  backbone network system 100
  multiple transmitters 115
  transmitters 117
  second backbone network system 200
  common data source 300
  ethernet ring network 320
  first network switch 322
  second network switch 324
  third network switch 326
  ethernet downlink 332
  ethernet downlink 334
  ethernet cable 336a
  ethernet cable 336b
  overall method 700
  initial communication 705
  master designated 710
  interface communication 715
  monitor communication 720
  overtaking 725
  continued monitoring 730
  relinquishing control 735
  testing operation 740
  configuring network 800
  connecting backbone 805
  connecting endpoint 810
  communication with data sources 815
  configuring master communication source 820
  configuring monitoring interface 825
  configuring continual monitoring 830
  relinquishing control 835
  configuring independent communicating 840 configuring primary interface to transmit 850
  receiving calibration messages 855
  transmitting calibration messages 860
  providing status messages 865
  reacting to short 900
  separating input and output 902
  maintaining open switches 904
  measuring impedance 906
  transmitting impedance 908
  evaluating impedance 910
  comparing impedance 912
  decreased impedance 913
  short event 914
  increased impedance 915
  closing switches 916
  transmitting status 918
  determining short on input 1000
  testing impedance 1001
  generating tx message 1002
  closing tx relay 1003
  closing rs relay 1004
  generating rs message 1005
  receiving test message 1006
  generating failure message 1007
  receiving confirmation 1008
  generating failure message 1009
  moving to full communication 1010
  determining short on output 1100
  testing impedance 1101
  generating tx message 1102
  closing tx relay 1103
  closing rs relay 1104
  generating rs message 1105
  receiving test message 1106
  generating failure message 1107
  receiving confirmation 1108
  generating failure message 1109
  moving to full communication 1110

CONCLUSION

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims. For example, while the invention has been described with reference to RS-485 network topologies, the above-described architecture may also be suitable for similar or derivative communication standards.

I claim:

1. An endpoint interface device, associated with an endpoint device on a multi-drop communications network system, the system further having at least one data source and a multi-drop network connection, the endpoint interface device comprising:
    an interconnection architecture connecting the multi-drop network connection to the associated endpoint device as separate input interconnecting multi-drop lines and separate output interconnecting multi-drop lines; and
    a monitoring circuitry connected to each of the input and output connection lines, and the monitoring circuitry being capable of monitoring and assessing each of the input and output connection lines.

2. The endpoint interface device of claim 1, further comprising:
    an isolation circuitry connected to each of the input and output connection lines, and the isolation circuitry being capable of disconnecting each of the input interconnecting multi-drop lines from the endpoint device, individually, and being capable of disconnecting each of the output interconnecting multi-drop lines from the endpoint device, individually.

3. The endpoint interface device of claim 2, wherein:
    the monitoring circuitry being capable of comparing an assessed value of each of the input and output connection lines to a predetermined proper value, and instructing the isolation circuitry to isolate an indicated interconnecting multi-drop connection on an associated one of the input interconnection lines and the output interconnection lines; and
    the monitoring circuitry being capable of measuring and reporting an isolation event and the measured impedance values on valid interconnection multi-drop lines to the at least one data source.

4. The endpoint interface device of claim 1, further comprising a microprocessor having polarity correction software being capable of correcting transmitting and receiving connection polarities as employed by endpoint transceivers.

5. The endpoint interface device of claim 1, wherein the endpoint interface device is constructed and arranged to report messages relating to endpoint isolation action and interconnection impedance values measured.

6. The endpoint interface device of claim 1, further comprising interconnection circuitry between a second interconnecting multi-drop transmit line and a ground line, for each of an input multi-drop connection and an output multi-drop connection; and interconnection circuitry between a second interconnecting multi-drop receiving line and the ground line, for each of an input multi-drop connection and an output multi-drop connection.

* * * * *